(12) United States Patent
Natsuhara et al.

(10) Patent No.: US 7,855,569 B2
(45) Date of Patent: *Dec. 21, 2010

(54) WAFER HOLDER FOR WAFER PROBER AND WAFER PROBER EQUIPPED WITH THE SAME

(75) Inventors: Masuhiro Natsuhara, Itami (JP); Katsuhiro Itakura, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 863 days.

This patent is subject to a terminal disclaimer.

(21) Appl. No.: 11/287,847

(22) Filed: Nov. 29, 2005

(65) Prior Publication Data

US 2006/0186904 A1 Aug. 24, 2006

(30) Foreign Application Priority Data

| Nov. 30, 2004 | (JP) | ............................. 2004-346460 |
| Feb. 9, 2005 | (JP) | ............................. 2005-033155 |
| Jul. 13, 2005 | (JP) | ............................. 2005-203750 |
| Oct. 31, 2005 | (JP) | ............................. 2005-315550 |

(51) Int. Cl.
*G01R 31/02* (2006.01)
*G01R 31/28* (2006.01)

(52) U.S. Cl. ........................................... 324/760
(58) Field of Classification Search .............. 324/158.1, 324/760–765; 361/234

See application file for complete search history.

(56) References Cited

U.S. PATENT DOCUMENTS

| 7,397,648 B2 * | 7/2008 | Otaka et al. ............... 361/234 |
| 2007/0046306 A1 * | 3/2007 | Awazu et al. ............... 324/760 |
| 2007/0046307 A1 * | 3/2007 | Itakura et al. ............... 324/760 |

FOREIGN PATENT DOCUMENTS

| JP | 2001-033484 A | 2/2001 |
| JP | 2001-210683 A | 8/2001 |
| JP | 2001-319964 A | 11/2001 |
| JP | 2003-163244 A | 6/2003 |
| JP | 2003-179127 A | 6/2003 |
| JP | 2004-014655 A | 1/2004 |
| JP | 2004-128509 A | 4/2004 |
| JP | 2004-153288 A | 5/2004 |
| JP | 2004-172463 A | 6/2004 |
| JP | 2004-214690 A | 7/2004 |

* cited by examiner

*Primary Examiner*—Minh N Tang
*Assistant Examiner*—Trung Q Nguyen
(74) *Attorney, Agent, or Firm*—James W. Judge

(57) ABSTRACT

The invention provides a wafer-prober wafer holder that allows positional precision and temperature uniformity to be increased, and also allows the chip to be heated and cooled rapidly, and a wafer prober device provided with the same. The wafer-prober wafer holder of the invention is constituted by a chuck top having a chuck top conducting layer on its surface, and a support member for supporting the chuck top, and has a cavity in a portion between the chuck top and the support member. The chuck top preferably is provided with a heating member.

44 Claims, 8 Drawing Sheets

WAFER HOLDER FOR WAFER PROBER AND WAFER PROBER EQUIPPED WITH THE SAME

BACKGROUND OF THE INVENTION

1. Technical Field

The present invention relates to wafer holders and heater units employed in wafer "probers," wafer testing stations in which a semiconductor wafer is set on a wafer-carrying side of the wafer holder or heater unit, and a probe card is pressed against the wafer to test the wafer's electrical characteristics.

2. Description of the Related Art

Conventionally in semiconductor inspection operations, heating processes are carried out on the substrates (wafers) that bear the semiconductor devices under test. In particular, a "burn-in" procedure for preventing post-shipment incidents of failure is carried out by ramping up the wafers to a temperature higher than the temperature level at which they are normally used, to accelerate the failure of and eliminate any potentially defective semiconductor dies (chips). In a burn-in procedure, after device circuitry has been formed on a semiconductor wafer, but before the wafer is singulated into individual chips, the electrical performance of each die is measured while the wafer is heated, and defective dies are excluded. There has been strongly felt need to shorten process time in burn-in procedures, in order to boost throughput.

Heaters are employed in such burn-in testing, both for retaining the semiconductor substrates as well as for heating the semiconductor substrates. Since conventional heaters require contacting the entire surface of the wafer back side onto a ground electrode, devices made of metal have been employed. A wafer on which circuitry has been formed is placed atop a flat metallic heater, and the electrical characteristics of the dies are measured. During the measurement, because a measuring element that is referred to as a probe card and is furnished with numerous current-conducting electrode pins is pressed onto the wafer with a force of from several dozen kgf to several hundred kgf, if the heater is thin it can become deformed, such that faulty contact between the wafer and the probe pins occurs. Consequently, with the goal of maintaining heater stiffness requiring a thick metal plate of at least 15 mm thickness, heater ramp-up/down necessitates a prolonged period, which seriously impairs improvement in throughput.

A further problem is that in burn-in procedures, current flows into the dies to measure their electrical characteristics along with the heightening of chip output power in recent years, dies emit considerable heat when their electrical characteristics are tested and, depending on the situation, a die can be destroyed by its own heat emission. This has led to demands for rapid cooling of the wafer after it is tested. Meanwhile, temperature that is as uniform as possible during the measurement operation is also called for. Given these demands, copper (Cu), with a high thermal conductivity of 403 W/mK, is used as the metal constituting the heater.

To address these issues, a wafer prober that is insusceptible to deformation and has a small heat capacity is proposed in Japanese Unexamined Pat. App. Pub. No. 2001-033484, by means of, instead of a thick metal plate, a thin metal layer formed on the front side of a ceramic baseplate that despite being thin is highly stiff and not prone to deforming. This reference maintains that the heater's high degree of stiffness eliminates occurrences of faulty contact, and that the heater's small heat capacity enables shortened ramp-up and ramp-down times. The reference also has it that aluminum alloys or stainless steels can be employed as a support platform for installation of the wafer prober.

Nevertheless, as noted in Pat. App. Pub. No. 2001-033484, if only the circumferential verge of the wafer prober were supported, the heater could warp under the pressing force of the probe card, which thus necessitated providing numerous support posts, or a similar design.

Furthermore, the continuing development of ultra large-scale integration of semiconductor processes has been accompanied by an increase in the load per unit area during wafer probing tests, which in turn has called for precision aligning of the probe card with the prober. Probers routinely repeat operations of heating the wafer to a predetermined temperature, shifting into a predetermined position during the probing test, and pressing a probe card against the wafer. In the course of the operations, high positioning precision is demanded of the prober drive system in order to move it into the predetermined position.

A problem with the prober drive system, however, is that when the wafer is heated to the predetermined temperature, i.e., a temperature on the order of 100 to 200° C., the heat is transmitted to the drive system and the various metal parts of the drive system thermally expand, on account of which the system precision is compromised. In addition, the increase in load during the probing test has led to demands for stiffness in the wafer-carrying prober itself. That is, if the prober itself deforms under the load during a probing test, the problem will be that the pins on the probe card cannot contact the wafer uniformly, which will make the test impossible, or at worst, damage the wafer. Probers are consequently made larger scale in order to minimize prober deformation, but the problem with enlarging the probers is that their weight increases, and the weight increase influences the precision of the drive system. What is more, with lager prober size has come the problem that the heating up and cooling times are extensively prolonged, lowering throughput.

In order to improve throughput, meanwhile, probers are often provided with a cooling mechanism to improve ramp-up/down speed. Nevertheless, cooling mechanisms conventionally have been air-cooling, as in Japanese Unexamined Pat. App. Pub. No. 2001-033484, for example, or else a cooling plate has been provided directly beneath the metallic heater. The problem with the former case has been that inasmuch as the mechanism is air-cooling, the cooling speed is slow. The problem with the latter case has been that, with the cooling plate being metal, because the pressure of the probe card is acts directly on the cooling plate during a probing test, the plate is liable to deform.

BRIEF SUMMARY OF THE INVENTION

The present invention was brought about in order to solve the above problems. In particular, it is an object of the present invention to afford a wafer-prober wafer holder, and a wafer probing station in which the wafer holder is installed, that has a high degree of stiffness and enhanced heat insulating effectiveness to improve in positioning precision and improve in temperature uniformity, and to enable dies to be rapidly ramped up and ramped down.

A wafer-prober wafer holder of the present invention is constituted by a chuck top having a chuck-top conducting layer on its front side, and a support member for supporting the chuck top, and has a cavity in a portion of the holder between the chuck top and the support member. The chuck top preferably is furnished with a heating member.

The support member preferably is in the form of a closed-ended cylinder, and the Young's modulus of the support member preferably is at least 200 GPa and its thermal conductivity not more than 40 W/mK. Further, the thickness of the cylindrical portion of the support member preferably is not more than 20 mm, and the height of the cylindrical portion preferably is at least 10 mm. The bottom portion of the support member preferably is at least 10 mm thick. Also, the cylindrical of the support member need not be integral with its bottom portion.

The support member preferably has a heat-insulating structure where it contacts the chuck top, and the insulating structure preferably is cuts formed in the support member, or columnar components formed in the support member. The surface area of the portion of the support member that is in contact with the chuck top desirably is not more than 10% of the support-member facing surface area of the chuck top. The portion of contact preferably is in the range of within 5 mm from the chuck top outer circumference. The cuts are preferably in strip-like or radial form, and the layout of the cuts or columnar components preferably is an arrangement equal to or resembling a pattern of concentric circles, and are at least 8 in number.

The surface roughness of the region of contact between the support member and the chuck top or columnar components preferably is at least 0.1 µm Ra, and the surface roughness of the rear surface of the bottom portion of the support member preferably is at least 0.1 µm Ra. Further, if the cylinder portion and the bottom portion of the support member are not integral, then the surface roughness of at least the bottom portion or the cylinder portion of the region of contact between the bottom portion and the cylinder portion of the support member preferably is at least 0.1 µm Ra. Also, the surface roughness of the region of contact between the columnar components and the support member and/or the chuck top preferably is at least 0.1 µm Ra.

The degree of perpendicularity between the outer circumferential portion of the cylinder portion of the support member and the surface of the support member that is in contact with the chuck top, or between the outer circumferential portion of the cylinder portion of the support member and the surface of the cylindrical members that is in contact with the chuck top, preferably is 10 mm or less, when converted to a 100-mm measurement length.

The main component of the material making up the support member preferably is any one of mullite, alumina, or a composite of mullite and alumina, and preferably a metal layer is formed on the surface of the support member. It is also preferable that a conducting member is provided on at least some of the support member surface. It is further preferable that support posts are provided in a substantially central portion of the support member.

It is preferable that an electromagnetic shield electrode layer and a guard electrode layer are provided between the chuck top and the heating member, and it is also preferable that electrically insulating layers are provided between the electromagnetic shield electrode layer and the guard electrode layer, and between the guard electrode layer and the chuck top. The insulating layers preferably have a resistance of at least $10^7 \Omega$, and more preferably at least $10^{10} \Omega$. The insulating layers preferably have a dielectric constant of 10 or less. The capacitances between the chuck top conducting layer and the guard electrode layer and between the chuck top conducting layer and the electromagnetic shield layer, or between the chuck top and the guard electrode layer and between the chuck top and the electromagnetic shield electrode layer, preferably both are 5000 pF or less, and more preferably 1000 pF or less. The insulating layers preferably are at least 0.2 mm thick, and more preferably at least 1 mm thick. The support member preferably is provided with through-holes or cuts for leads from a heater electrode for the heating member and the electromagnetic shield electrode.

The amount of warping in the surface of the chuck top conducting layer preferably is 30 µm or less, particularly when the chuck top is in a −70° C. to 200° C. temperature range. It is also preferable that the surface roughness of the chuck top conducting layer surface is 0.1 µm Ra or less. Further, it is preferable that the degree of parallelism between the surface of the chuck top conducting layer and the bottom portion rear surface of the support member is 30 µm or less.

The chuck top preferably has a Young's modulus of at least 200 GPa, and preferably has a thermal conductivity of at least 15 W/mK. The chuck top preferably is at least 8 mm thick. The material making up the chuck top preferably is a composite of a metal and a ceramic, and more preferably either a composite of aluminum and silicon carbide or a composite of silicon and silicon carbide.

The material making up the chuck top can be a ceramic, and more preferably is any one of alumina, mullite, silicon nitride, aluminum nitride, and a composite of alumina and nitride. It is further preferable that when the material making up the chuck top is alumina, its purity is at least 99.6%, and more preferably at least 99.9%. The material making up the chuck top can be a metal, and preferably is tungsten, molybdenum, or an alloy of these.

It is preferable that the amount of warping in the surface of the chuck top conducting layer is 30 µm or less when a load of 3.1 MPa has been applied to the surface of the chuck top conducting layer.

It is preferable that a cooling module is provided on the cylindrical portion of the support member, and depending on the application or goal, the cooling module can mobile or can be fastened to the chuck top. It is also preferable that the chuck top is provided in a single unit with the cooling module, in which case it is preferable that a chuck top deformation prevention substrate is provided on the surface of the chuck top that is opposite its wafer resting surface. It is also preferable that a deformation prevention substrate having the function of the chuck top is provided on the cooling module.

A wafer-prober heater unit for that is provided with such a wafer-prober wafer holder, and a wafer prober provided with this heater unit, have a high degree of stiffness and enhanced heat-insulating effectiveness, thereby enabling improvement in positional precision and temperature uniformity, and enabling rapid heating and cooling of dies.

DETAILED DESCRIPTION OF THE INVENTION

Figure 1:
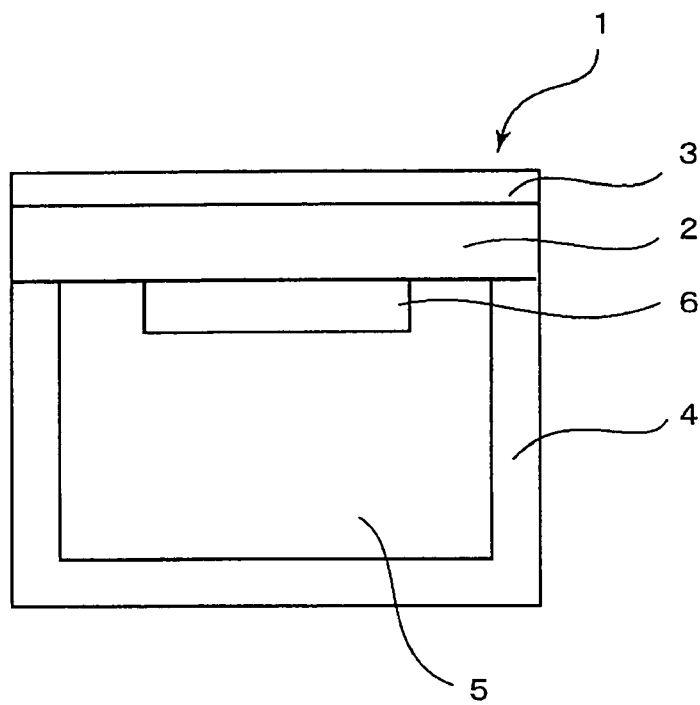
FIG. 1 illustrates an example of the cross-sectional structure of a wafer-prober wafer holder of the invention.

An embodiment of the invention is described in reference to FIG. 1. FIG. 1 is an example of an embodiment of the invention. A wafer holder 1 for wafer prober of the invention is made of a chuck top 2 that has a chuck top conducting layer 3 and a support member 4 for supporting the chuck top, and has a cavity 5 in a portion between the chuck top 2 and the support member 4. The presence of the cavity 5 increases the heat insulating effect. There are no particular limitations regarding the shape of the cavity, only that it has a shape that allows it to significantly curb the amount of heat that has been generated at the chuck top or cold air that is transferred to the support member. Giving the support member 4 the shape of a cylinder provided with a bottom allows the contact area between the chuck top and the support member to be reduced and allows the cavity 5 to be formed easily, and thus is preferable. Forming the cavity 5 turns most of the region between the chuck top and the support member into an air layer, and this produces an efficient heat insulating structure.

Figure 14A:
FIG. 14 illustrate another example of the cross-sectional structure and the plan-view structure of a support member of a wafer-prober wafer holder of the invention.
Figure 14B:
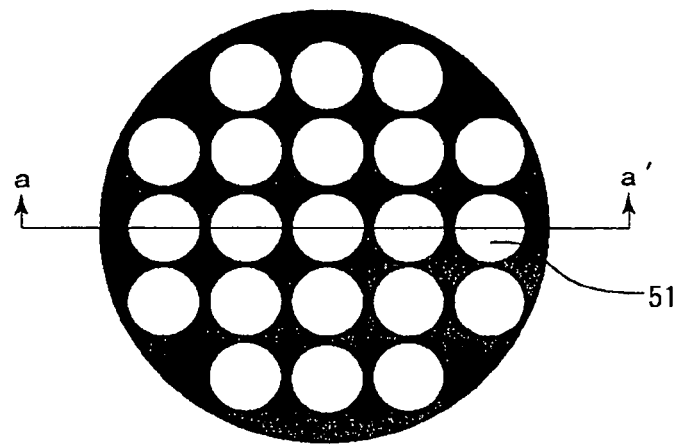
Figure 15A:
FIG. 15 illustrate yet another example of the cross-sectional structure and the plan-view structure of a support member of a wafer-prober wafer holder of the invention.
Figure 15B:
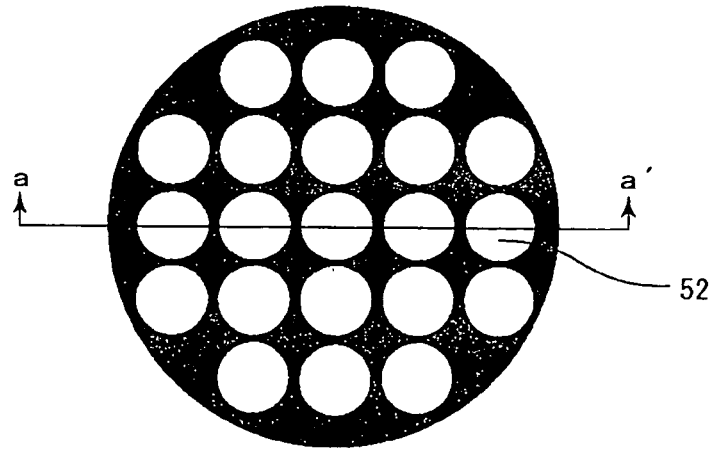

As for the shape of the support member, it is only necessary that its shape allows the cavity to be formed between the chuck top and the support member, and for example, as shown in FIG. 14, it can be a shape that has numerous through-holes 51. It should be noted that FIG. 14A is a plan view of a section taken along the line a-a' in FIG. 14B. The same applies for FIGS. 15, 16, and 17. The through-holes can be circular, polygonal such as triangular or rectangular, elliptical, or other shapes. They also may be a combination of these shapes. It is also possible for the through-holes to have a recessed shape 52, for example, as shown in FIG. 15. It is also possible to adopt a combination of through-holes and recessed shapes. It is only necessary that the amount of heat generated at the chuck top that is transferred to the support member can be reduced by forming a cavity between the chuck top and the support member.

Figure 16A:
FIG. 16 illustrate a different example of the cross-sectional structure and the plan-view structure of a support member of a wafer-prober wafer holder of the invention.
Figure 16B:
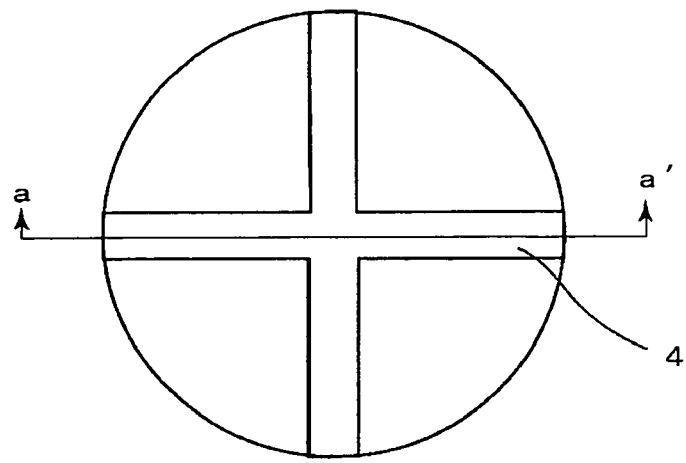
Figure 17A:
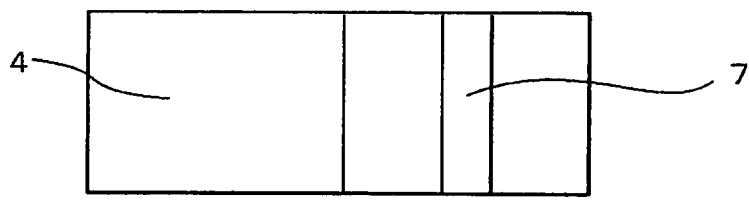
FIG. 17 illustrate a still further example of the cross-sectional structure and the planar structure of a support member of a wafer-prober wafer holder of the invention.
Figure 17B:
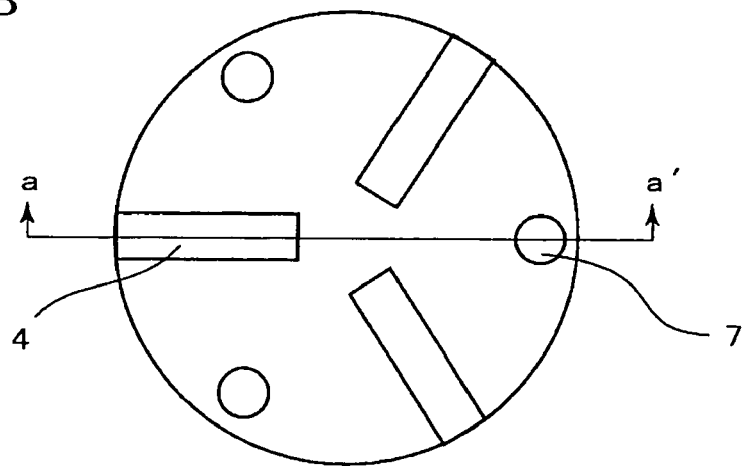

Further, the support member can have the shape of support beams. For example, as shown in FIG. 16, supporting the chuck top through four beams in the shape of a cross allows the chuck top to be supported linearly, thereby making it harder for the chuck top to become distorted and allows the chuck top to supported relatively firmly. As shown in FIG. 17, it is also possible to provide support posts 7 at sections that are not supported by beams. The support posts and beams preferably are made of the same material. The sections that cannot be supported by the beams can be reinforced by the support posts, allowing distortion of the chuck top to be reduced. The number of beams can be four (FIG. 16) and three (FIG. 17) as well as five or more. The beams can be connected as in FIG. 16 or apart as in FIG. 17. Further, the beams can be integral with or separate from the bottom portion of the support member.

The chuck top preferably is provided with a heating member 6. This is because in recent years it is often necessary during semiconductor probing to heat the wafer to a temperature in the range of 100 to 200° C. Therefore, if the heat of the heating member for heating the chuck top cannot be kept from being transferred to the support member, then the heat is transferred to the drive system provided below the wafer prober support member, and the thermal expansion differences between its components causes discrepancies in machine precision and noticeably worsens the planarity and parallelism of the chuck top upper surface (wafer resting surface). However, since the current structure is a insulating structure, the planarity and parallelism are not noticeably worsened. Further, being a hollow structure allows the current structure to be lighter than a cylindrical support member.

Figure 2:
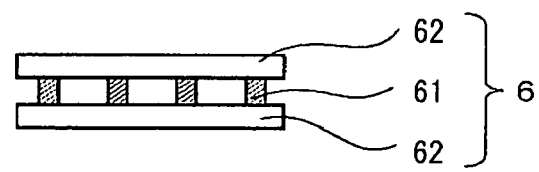
FIG. 2 illustrates an example of the cross-sectional structure of a heating member of the invention.

The heating member 6 shown in FIG. 2 has the simple structure of a resistance heat-emitting member 61 sandwiched by an insulator 62 such as mica, and thus is preferable. A metal can be used for the resistance heat-emitting member. For example, it is possible to use a metal foil of nickel, stainless steel, silver, tungsten, molybdenum, chrome, or an alloy of these metals. Of these metals, stainless steel and Nichrome™ are preferable. When processing stainless steel or Nichrome™ into the shape of the heat-emitting member, a method such as etching can be used to form the resistance heat producing circuit pattern with relatively good precision. Further, since these are inexpensive and have the ability to withstand oxidation, they can withstand extended periods of use even at elevated usage temperatures, and thus are preferable. There are no particular limitations regarding the insulator sandwiching the heat-emitting member, and it is only necessary that the insulator is heat resistant. There are no particular limitations to mica, which was mentioned above, and it also may be a silicon resin, an epoxy resin, or a phenolic resin, for example. If the heating member is sandwiched by such an insulating resin, then it is also possible to disperse fillers throughout the resin in order to more smoothly transfer the heat that is produced by the heat-emitting member to the chuck top. The role of the fillers dispersed throughout the resin is to increase the thermal conduction of the silicon resin, for example, and there are no limitations regarding the filler material except that the filler material does not react with the resin, and possible examples include substances such as boron nitride, aluminum nitride, alumina, and silica. The heating member also can be fastened to the portion on which it rests using mechanical means, such as being screwed in place.

The Young's modulus of the support member preferably is at least 200 GPa. When the Young's modulus of the support member is less than 200 GPa, the bottom portion of the support member cannot be made thin, and thus it is not possible to secure a cavity portion of sufficient volume, which precludes an insulating effect. It is also not possible to a secure spot for placing the cooling module, which is described later. A more preferable Young's modulus is at least 300 GPa. Using a material that has a Young's modulus of at least 300 GPa allows deforming in the support member to be significantly reduced, and thus the support member can be made more compact and lighter and therefore is particularly preferable.

The thermal conductivity of the support member preferably is not more than 40 W/mK. When the thermal conductivity of the support member exceeds 40 W/mK, the heat that is applied to the chuck top is easily transferred to the support member and affects the precision of the drive system, and thus is not preferable. In recent years, high temperatures such as 150° C. are required when probing, and thus the thermal conductivity of the support member more preferably is not more than 10 W/mK. More preferably, the thermal conductivity is not more than 5 W/mK. This is because a thermal conductivity on this order results in a significant drop in the amount of heat that is transferred from the support member to the drive system. Preferable specific materials for the support member that meet these conditions include mullite, alumina, and a composite of mullite and alumina (mullite-alumina composite). Mullite is preferable because its thermal conductivity is small and therefore has a large insulating effect, and alumina is preferable because its Young's modulus is large and therefore is very hard. The mullite-alumina composite is preferable overall because its thermal conductivity is smaller than that of alumina and its Young's modulus is larger than that of mullite.

It is also possible to use a metal such as stainless steel as the material for the support member. Stainless steel, a cast-metal object, is inexpensive and thus preferable. If there are beams like in FIG. 16 and FIG. 17, then having a metal beam portion and a bottom portion made of a material with a relatively high Young's modulus allows deformation of the chuck top to be inhibited further.

The thickness of the cylinder portion of a support member in the shape of a cylinder provided with a bottom is preferably not more than 20 mm. When over 20 mm, the amount of heat that is transferred from the chuck top to the support member increases, and thus is not preferable. Thus, the thickness of the cylinder portion of the support member for supporting the chuck top preferably is not more than 20 mm. However, when the thickness is less than 1 mm, the pushing force when the probe card is pressed against the wafer during inspection of the wafer may deform, and in a worst-case scenario, crack, the cylinder portion of the support member, and thus a thickness less than 1 mm is not preferable. The most preferable thickness is from 10 mm to 15 mm. Further, it is preferable that the cylinder portion that comes into contact with the chuck top is 2 to 5 mm thick. A thickness on this order provides the support member with a good balance of strength and heat resistance, and thus is preferable.

The height of the cylinder portion of the support member is preferably at least 10 mm. When the height is less than 10 mm, the pressure from the probe card during wafer inspection is applied to the chuck top and then transferred down to the support member, causing bending in the bottom portion of the support member that worsens the planarity of the chuck top, and thus is not preferable.

The thickness of the bottom portion of the support member is preferably at least 10 mm. When the thickness of the support member bottom portion is less than 10 mm, the pressure from the probe card during wafer inspection is applied to the chuck top and then transferred down to the support member, causing bending in the bottom portion of the support member that worsens the planarity of the chuck top, and thus is not preferable. Preferably, the thickness is between 10 mm and 35 mm. This is because when less than 10 mm, the heat of the chuck top is easily transferred down to the support member bottom portion, and the support member warps as it expands under the heat, decreasing the degree of planarity and parallelism of the chuck top, and thus is not preferable. A thickness of 35 mm or less allows for a compact unit, and is ideal. It is also possible for the cylinder portion and the bottom portion of the support member to be separated rather than integral. In such a case, the cylinder portion and the bottom portion, which are separate from one another, both have an interface that becomes a heat resisting layer that stops heat that has been transferred from the chuck top to the support member, and thus the temperature of the bottom portion does not rise easily, and this is preferable.

If the support member has a shape like in FIG. 14 or FIG. 15, then although there are no particular limitations regarding the spacing between the through-holes or recessed shapes (the minimum distance between through-holes or recessed holes), that spacing is preferably small in order to increase the insulating effect. Specifically, the spacing preferably is within 50 mm, and more preferably within 20 mm. However, there is a risk that the support member will crack when the spacing is less than 0.1 mm, and therefore the spacing is preferably at least 0.1 mm.

Figure 3:
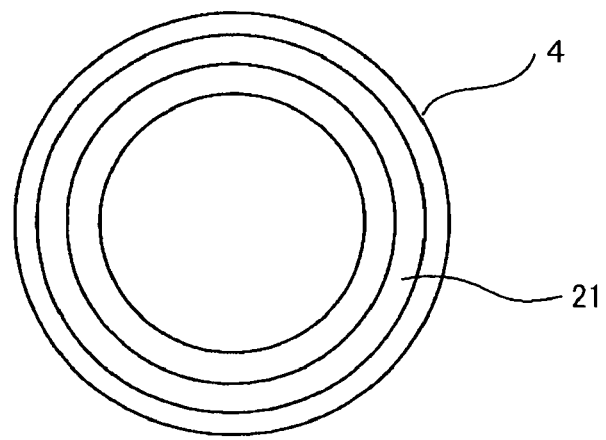
FIG. 3 illustrates an example of a heat-insulating structure of the invention.
Figure 4:
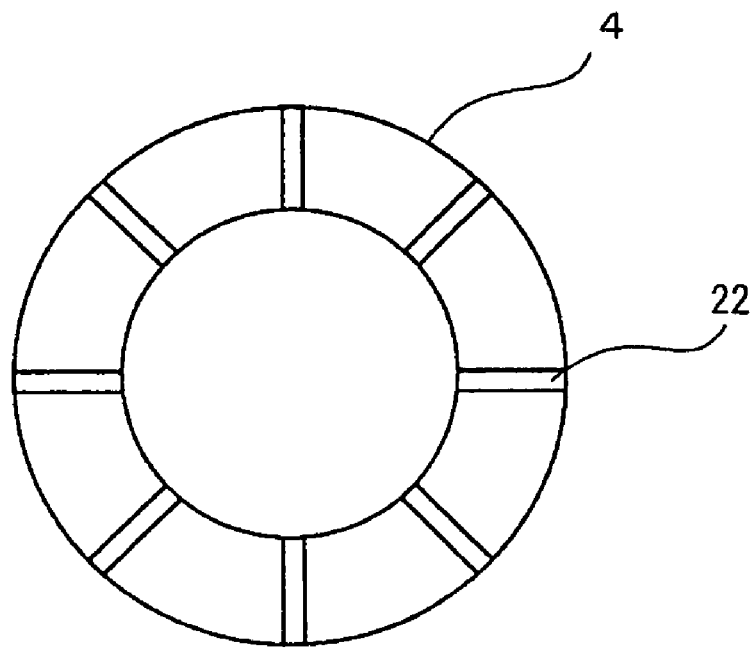
FIG. 4 illustrates another example of a heat-insulating structure of the invention.

Preferably, the support surface of the support member for supporting the chuck top has a heat-insulating structure. The insulating structure can be formed by forming cutting channels in the support member to reduce the contact area between the chuck top and the support member. It is also possible to form an insulating structure by forming cutting channels in the chuck top. In this case, it is necessary that the Young's modulus of the chuck top is at least 200 GPa. That is, since the pressure of the probe card is applied to the chuck top, when cuts are present in a material with a small Young's modulus, the amount that the material is deformed will only increase, and this increase in the amount of deformation may lead to cracking in the wafer and even crack the chuck top itself. However, forming the cuts in the support member obviates this problem, and thus is preferable. There are no particular limitations regarding the shape of the cuts, and cuts can be formed as concentric annular grooves 21 as in FIG. 3, as radial grooves 22 as in FIG. 4, or as numerous projections, for example. However, regardless of the shape, it is necessary for the cuts to be formed symmetrically. If the cuts are not symmetrical, then the pressure that is applied to the chuck top cannot be diffused uniformly and this may lead to deformation and cracking in the chuck top, which is not preferable.

Figure 5:
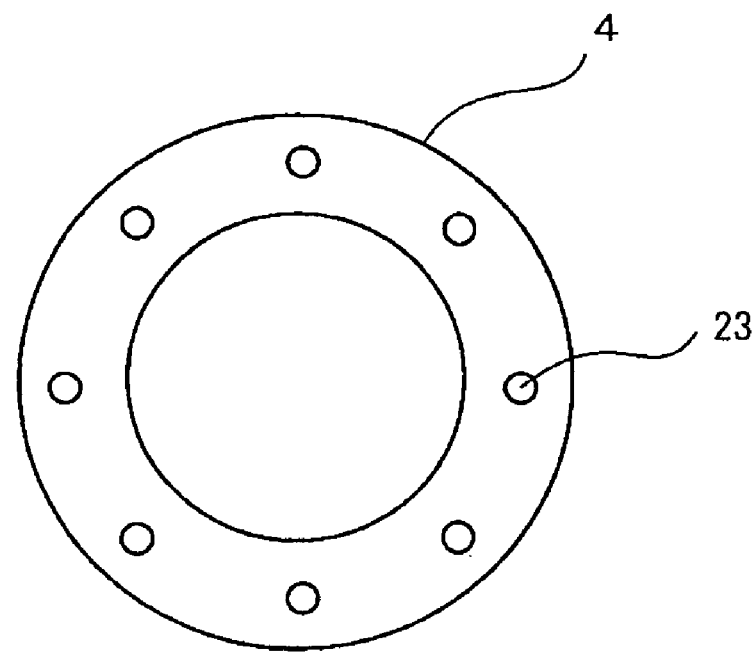
FIG. 5 illustrates yet another example of a heat-insulating structure of the invention.

Regarding the form of the insulating structure, as shown in FIG. 5 it is preferable that a plurality of columnar components 23 are disposed between the chuck top and the support member. As for how they are arranged, preferably at least eight columnar components 23 are disposed in concentric circles, evenly, or in a similar arrangement. In particular, since wafers in recent years have increased in size to 8 to 12 inches, fewer than this number will result in a large distance between columnar components, and when pressing the pins of the probe card against the wafer resting on the chuck top there is a greater likelihood that bending will occur between those columnar components, and this is not preferable. Compared to a case where the two are provided in one unit, if the contact area with the chuck top is the same, then it is possible to form two interfaces, one between the chuck top and the columnar components and another between the columnar components and the support member, and thus those interfaces become heat resisting layers, and allow the number of heat resisting layers to be doubled, and thus the heat that is generated at the chuck top can be effectively insulated against. There are no particular limitations regarding the shape of the columnar components, and they can be cylindrical, triangular, rectangular, or any other polygonal shape or pipe-shaped, for example. Whatever the case, inserting the columnar components allows the transmission of heat from the chuck top to the support member to be blocked.

It is preferable that the thermal conductivity of the material for the columnar components used in the insulating structure is not more than 30 W/mK. When the thermal conductivity is higher than this the insulating effect decreases, and thus is not preferable. Examples of material for the columnar components include $Si_3N_4$, mullite, mullite-alumina composite, steatite, cordierite, stainless steel, glass (fiber), heat-resistant resin such as polyimide, epoxy resin, or phenolic resin, or a composite of these.

The surface roughness of the region of contact between the support member and the chuck top or the columnar components preferably is at least 0.1 μm Ra. If the surface roughness is less than 0.1 μm Ra, then the contact area between the support member and the chuck top or the columnar components increases and the cavity between the two becomes relatively small, and thus more heat is transmitted than when the surface roughness is at least 0.1 μm Ra, and thus is not preferable. There is no particular upper limit to the surface roughness. However, a surface roughness of Ra greater than 5 μm requires higher costs in order to process that surface. Examples of methods for achieving a surface roughness of at least 0.1 μm Ra include processing involving polishing or sand blasting, for example. In this case, it is necessary to optimize the polishing conditions or the blasting conditions to keep the Ra at 0.1 μm or more.

It is also preferable that the surface roughness of the support member bottom portion is at least 0.1 μm Ra. As above, having a coarse surface on the support member bottom portion allows the amount of heat that is transmitted to the drive system to be reduced as well. If the bottom portion and the cylinder portion of the support member can be separated, then it is preferable that the surface roughness of the region of contact of at least one of the two is an Ra of at least 0.1 μm. A surface roughness smaller than this will lessen the effect of blocking the transfer of heat from the cylinder portion to the bottom portion. It is also preferable that the surface roughness of the columnar member surface in contact with the support member, and the surface roughness of the columnar member surface in contact with the chuck top, is at least 0.1 μm Ra. For the columnar components as well, increasing their surface roughness allows the transfer of heat to the support member to be reduced. Thus, by providing each member with an interface and setting the surface roughness of that interface to at least 0.1 μm Ra, it is possible to reduce the amount of heat that is transferred to the support portion bottom portion, and therefore the amount of power supplied to the heat-emitting member also can be effectively reduced.

The perpendicularity of the outer circumferential portion of the cylinder portion of the support member and the surface of the support member that is in contact with the chuck top, or the perpendicularity of the outer circumferential portion of the cylinder portion of the support member and the surface of the columnar components in contact with the chuck top, preferably are not more than 10 mm, with the measurement length having been scaled to 100 mm. For example, in a case where the perpendicularity exceeds 10 mm, the pressure that is applied to the cylinder portion of the support member from the chuck top will cause the cylinder portion itself to become prone to deforming in shape, and this it not preferable.

It is preferable that a metal layer is formed on the surface of the support member. The electric fields and electromagnetic waves generated by the heat-emitting member for heating the chuck top, the drive portions of the prober, and surrounding devices, etc., becomes noise when inspecting the wafer and may have an adverse effect, but forming a metal layer on the support member allows those electromagnetic waves to be blocked, and thus is preferable. There are no particular limitations regarding the method for forming the metal layer. For example, it is possible to use a brush or the like to apply a conducting paste, to which glass frit has been added to metal powder such as silver, gold, nickel, or copper, and then bake this.

It is also possible to form the metal layer by atomizing a metal such as aluminum or nickel. It is further possible to form a metal layer on the surface by plating. It is also possible to combine these methods. That is, it is possible to plate a metal such as nickel after the conducting paste has been baked, or to form a plate after atomizing. Of these methods, plating and atomizing are particularly preferable. Plating is preferable because it results in a strong, close adhesion and is dependable. Atomizing is preferable because it is relatively low cost and can be used to form a metal film.

The metal layer can be provide a conductor in at least a portion of the surface of the support member. There are no particular limitations regarding the material used as long as it is a conductor. For example, it is possible to use stainless steel, nickel, or aluminum.

As regards the method for providing the conductor, it is possible to attach an annular conductor to the lateral surface of the support member. It is possible to form a metal foil made of a foregoing material in an annular shape that is larger than the outer diameter of the support member, and then attach this to the lateral surface of the support member. It is also possible to attach a metal foil or metal plate to the bottom surface portion of the support member, and by connecting this to the metal foil attached to the lateral surface of the support member, the effect of blocking electromagnetic waves (guard effect) can be increased. It is also possible to use the space within the support member and attach a metal foil or metal plate in this space, which is in the shape of a cylinder with a bottom, and by connecting this to the metal foil attached to the lateral surface and the bottom surface of the support member, the guard effect can be increased even further. Adopting this method allows the above effect to be achieved more inexpensively than in the case of plating or the application of a conducting paste, and thus is preferable. There are no particular limitations regarding the method for fastening the metal foil or metal plate to the support member, and for example it is possible to use metal screws to attach the metal foil and metal plate to the support member. It is also preferable that the metal foil and the metal plates on the bottom surface portion and the lateral surface portion of the support member are integral.

Figure 6:
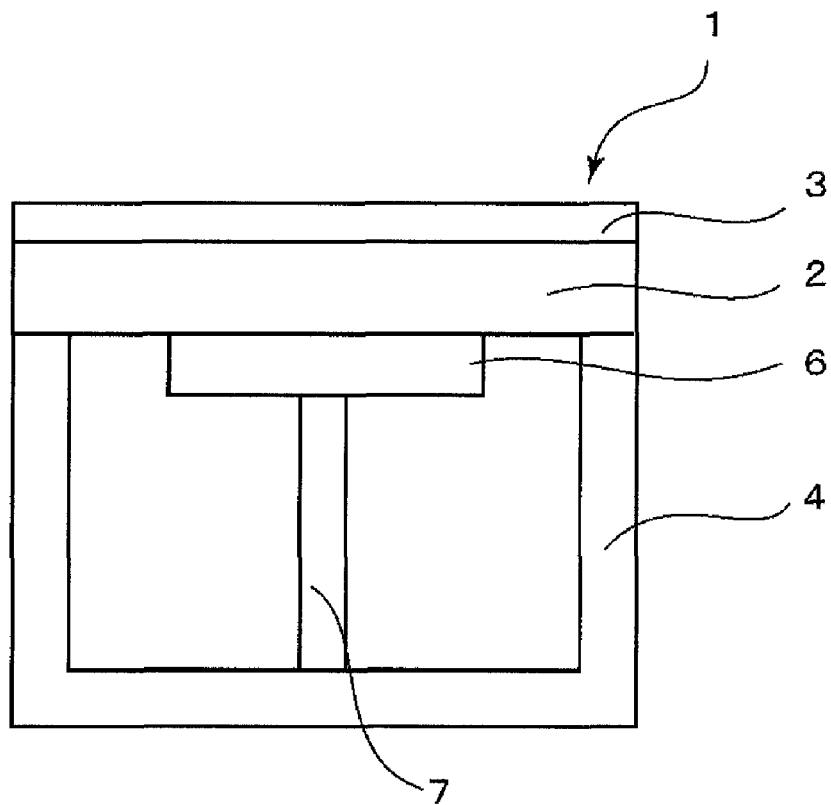
FIG. 6 illustrates another example of the cross-sectional structure of a wafer-prober wafer holder of the invention.

As shown in FIG. 6, it is also preferable to provide support posts 7 near the center of the support member 4. The support posts can keep the chuck top from deforming when the probe card is pressed against the chuck top. The material of the support posts in this central portion preferably is the same material as the support member. Since the support member and the support posts both receive heat from the heating member for heating the chuck top, they undergo thermal expansion. Here, when the material of the support member is different, the difference in their thermal expansion coefficients results in height differences between the support member and the support posts, which makes the chuck top more prone to deforming, and thus is not preferable. There are no particular limitations regarding the size of the support posts, but preferably their cross-sectional area is at least 0.1 cm². A cross-sectional area below this will not provide sufficient support and makes the support posts more prone to deforming, and thus is not preferable. It is also preferable that the cross-sectional area is not more than 100 cm². A cross-sectional area greater than this will reduce the size of the cooling module that is inserted into the cylinder portion of the support member, as discussed later, and this lowers its cooling effect and therefore is not preferable. There support posts are not particularly limited in their shape, and for example can be cylindrical columns, triangular columns, rectangular columns, or pipe-shaped. There are no particular limitations regarding the method for fastening the support posts to the support member. Possibilities include brazing with active metal, glass attach, and the use of screws. Of these, the use of screws is particularly preferable. This is because using screws allows the support posts to be attached and detached with ease, and moreover, there is no thermal processing performed during the fastening procedure, and thus deformation of the support member and the support posts due to thermal processing can be inhibited.

It is also preferable to form a metal layer for blocking (shielding) electromagnetic waves between the heating member for heating the chuck top and the chuck top. The role of this electromagnetic shield electrode layer is to shield noise that affects wafer probing, such as the electromagnetic waves and electric field that are generated by the heating member. This noise does not have a large impact when measuring normal electrical properties, but has a noticeable effect particularly when measuring the high-frequency properties of a wafer. As regards this electromagnetic shield electrode layer, a metal foil can be inserted between the heating member and the chuck top, and it is necessary to insulate the chuck top and the heating member. In this case, although there are no particular limitations regarding the metal foil that is used, it is preferable that a foil made of stainless steel, nickel, or aluminum is used because the heating member may reach temperatures on the order of 200° C.

With regard to the role of the insulating layer between the chuck top and the electromagnetic shield electrode layer, a circuit capacitor is formed between the electromagnetic shield electrode layer and the chuck top conducting layer formed on the surface of the chuck top on which the wafer rests if the chuck top is an insulating material, and between the chuck top itself and the electromagnetic shield layer if the chuck top is a conducting material, and this capacitor component has the effect of noise during wafer probing. Thus, to reduce the impact from this, the noise can be reduced by forming an insulating layer between the electromagnetic shield layer and the chuck top.

It is also preferable that a guard electrode layer is provided between the chuck top and the electromagnetic shield electrode layer with the insulating layer between them. The guard electrode layer, by connecting to the metal layer formed on the support member, can further reduce the noise impacts measurement of the high-frequency properties of a wafer. That is, in this invention, by covering the entire support member, including the heat-emitting member, with a conductor, it is possible to reduce the effects of noise when measuring wafer properties in high frequencies. Further, by connecting the guard electrode layer to the metal layer that is provided on the support member, it is possible to further reduce the effects of noise.

In that situation, it is preferable that the resistance of the insulating layers between the heating member and the electromagnetic shield electrode layer, between the electromagnetic shield electrode layer and the guard electrode layer, and between the guard electrode layer and the chuck top, is at least $10^7 \Omega$. A resistance less than $10^7 \Omega$ will lead to the heating member causing a tiny current that flows toward the chuck top conducting layer and becomes noise during probing that affects probing, and thus is not preferable. A resistance of at least $10^7 \Omega$ reduces this tiny current to a level that does not affect probing, and thus is preferable. In particular, the circuit patterns that are being formed on wafers have become increasingly small in recent years, and thus it is necessary to reduce such noise as much as possible, and by setting the resistance of the insulating layers to $10^{10} \Omega$ or more it is possible to achieve a structure that is even more reliable.

It is preferable that the dielectric constant of the insulating layer is not more than 10. An insulating layer dielectric constant greater than 10 causes charge to be more prone to build up in the electromagnetic shield layer, the guard electrode layer and the chuck top sandwiched by insulating layers and become a source of noise, and thus this is not preferable. In particular, wafer circuits have become increasingly small in recent years as mentioned above, making it necessary to reduce noise, and to this end a dielectric constant of 4 or less is preferable and 2 or less is particularly preferable. Setting a low dielectric constant allows the thickness of the insulating layer that is necessary to secure the insulation resistance and the capacitance to be reduced, and the thermal resistance due to the insulating layer can be reduced, and this is preferable.

It is preferable that the capacitances between the chuck top conducting layer and the guard electrode layer and between the chuck top conducting layer and the electromagnetic shield electrode layer when the chuck top is an insulating material, and the capacitances between the chuck top itself and the guard electrode layer and the chuck top and the electromagnetic shield electrode layer when the chuck top is a conducting material, are not more than 5000 pF. When the capacitance is over 5000 pF, then the insulating layer has a large capacitor effect and this has the effect of noise during probing, and thus is not preferable. In particular, a capacitance of 1000 pF or less allows good probing of wafer circuits, which have become increasingly integrated as discussed above, and thus is particularly favorable.

The above discussion has illustrated that noise that has an effect during probing can be significantly reduced by keeping the resistance, dielectric constant, and capacitance of the insulating layers within the aforementioned ranges. A preferable thickness of the insulating layers is at least 0.2 mm. In general it is favorable to have a thin insulating layer in order to attain a more compact device and to maintain good thermal conductivity from the heating member to the chuck top, but when the thickness goes below 0.2 mm, the insulating layer itself may become defective or have problems with durability, and thus such a thickness is not preferred. The ideal thickness for the insulating layer is 1 mm or more. A thickness on the order will not have problems with durability and will allow good transfer of heat from the heating member, and thus is preferably. Although there are no particular limitations regarding the upper limit to the thickness, it is preferable that the thickness is not more than 10 mm. Insulating layers thicker than this have a good ability to block noise, however, it takes time for the heat that is generated by the heating member to be conducted to the chuck top and the wafer and this makes it difficult to control the heating temperature, and thus are not preferable. Although the preferable thickness depends on the probing conditions, a thickness of less than 5 mm will allow temperature control to be carried out relatively easily, and thus is preferable.

There are no particular limitations regarding the thermal conductivity of the insulating layer, but as mentioned above, to achieve good heat transmission from the heating member it is particularly preferable that the thermal conductivity is at least 0.5 W/mK. A thermal conductivity above 1 W/mK allows the transmission of heat to become even better, and thus is preferable.

There are no particular limitations regarding the specific material for the insulating layer as long as the insulating layer has the above properties and has sufficient heat resistance to withstand the probing temperature, and possible examples thereof include ceramics and resin. Of these, preferable resins include silicon resin and silicon resin in which fillers have been dispersed, and preferable ceramics include alumina. The role of the filler dispersed in the resin is to increase the heat conduction of the silicon resin, and as for the filler material, there are no particular limitations other than that it does not react with the resin, and possible examples include substances such as boron nitride, aluminum nitride, alumina, and silica.

The region in which the insulating layer is formed preferably is at least equal to the electromagnetic shield layer and the area in which the guard electrode and heating member are formed. If the insulating layer is formed in too small of an area, then noise will infiltrate from sections that are not covered by the insulating layer, and this is not preferable.

An illustrative example of the insulating layer is described below. A silicon resin in which boron nitride has been dispersed is used as the insulating layer. The dielectric constant of this material is 2. In a case where silicon resin in which boron nitride has been dispersed serves as the insulating layer sandwiched by the electromagnetic shield layer and the guard electrode layer, and by the guard electrode layer and the chuck top, then if the chuck top is for a 12-inch wafer, the insulating layers are formed at a 300 mm diameter. Therein, setting the insulating layer thickness to 0.25 mm results in a capacitance of 5000 pF. Setting the thickness to 1.25 mm or more results in a capacitance of 1000 pF. The volume resistivity of the material is $9 \times 10^{15}$ $\Omega \cdot cm$, so the resistance can be set to around $1 \times 10^{12} \Omega$ if the layer is at least 0.8 mm thick when 300 mm diameter. The thermal conductance of the material is about 5 W/mK, and thus, although the thickness can be chosen based on the probing conditions, choosing a thickness of at least 1.25 mm allows sufficient values for the capacitance and resistance to be obtained.

Figure 7:
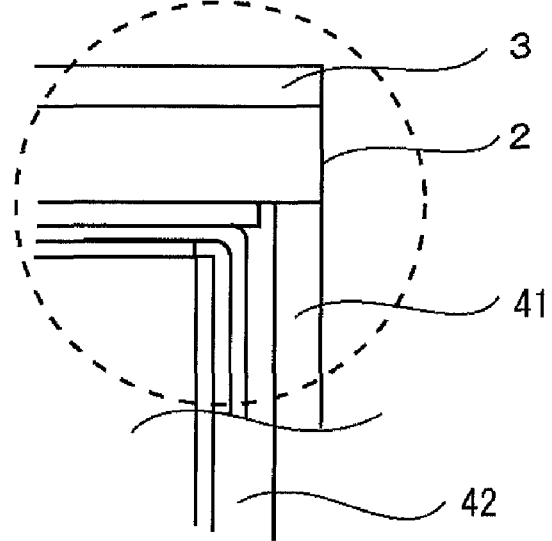
FIG. 7 illustrates an example of the cross-sectional structure of an electrode portion of a wafer-prober wafer holder of the invention.

As illustrated by the magnified cross-sectional view in FIG. 7, it is preferable that through-holes 42 through which to insert the electromagnetic shield electrode and the electrode for supplying power to the heating member are formed in the cylinder portion 41 of the support member 4. In this case, it is preferable that the through-holes are formed near the center of the cylinder portion of the support member. If the through-holes that are formed are near the outer circumferential portion of the support member, then pressure from the probe card may lower the strength of the support member, supported by the cylinder portion, and deform the support member near the through-holes, and thus is not preferable. It should be noted that the electrodes and the through-holes have been omitted in drawings other than FIG. 7.

Warping in the chuck top greater than 30 µm causes knocking of the prober needle against the chuck top during probing and keeps properties from being evaluated or inadvertently leads to a determination of defective due to poor contact, resulting in a poorer yield than necessary, and thus is not preferable. Further, poor contact likewise also occurs when the degree of parallelism between the surface of the chuck top conducting layer and the underside surface of the bottom portion of the support member is 30 µm or more, and this is not preferable. For the same reasons, it is also not preferable that, at room temperature, the warping in the chuck top and the degree of parallelism are not more than 30 µm and therefore good, whereas at 200° C. the warping in the chuck top and the degree of parallelism are greater than 30 µm. The same applies when probing at −70° C. In other words, it is preferable that warping and the degree of parallelism are not more than 30 µm over the entire temperate range at which probing may be conducted.

A chuck top conducting layer is formed on the surface of the chuck top on which the wafer is placed. Forming a chuck top conducting layer protects the chuck top against the corrosive gas, acid, alkaline chemicals, organic solvents, and water, etc., normally used in semiconductor manufacturing, as well as shields the region between the chuck top and the wafer placed on the chuck top from electromagnetic noise from below the chuck top, grounding it.

There are no particular limitations regarding the manner in which the chuck top conducting layer is formed, and some examples include applying a conducting paste through screen printing and then sintering, methods such as vacuum deposition and sputtering, and methods such as atomizing and plating. Of these methods, atomizing and plating are particularly favorable. These methods do not involve thermal processing when forming the conducting layer and thus warping due to thermal processing does not occur in the chuck top itself, and they also are relatively low cost and thus allow an inexpensive conducting layer with excellent properties to be attained. It is particularly preferable that a atomized film is formed on the chuck top and then a plated film is formed on top of this. This is because the atomized film more tightly adheres to ceramics and metal-ceramics than does the plated film. Further, depending the material that is atomized, such as aluminum or nickel, some oxides, nitrides, and oxygenates are formed during atomizing. Those compounds that are formed react with the surface of the chuck top to form a strong, tight adhesion.

However, the conductivity of the film that has been atomized is lowered because it includes these compounds. By contrast, plating allows a substantially pure metal to be formed, and thus although it does not adhere to the chuck top as tightly as the atomized film, it allows a conducting film having excellent conductivity to be formed. Accordingly, when a atomized film is formed as a primer and then a plated film is formed on top of that, the plated film has tight, strong adhesion to the atomized film because the atomized film is metal, and gives favorable electrical transmission properties, and thus this is particularly preferable.

It is preferable that the surface of the conducting layer on the chuck top has an Ra of not more than 0.5 µm. When the surface roughness exceeds 0.5 µm, then when measuring an element that generates a large amount of heat, there is a possibility that heat produced by the element itself during probing cannot be discharged from the chuck top and therefore elevates the temperature of the element and may even destroy the element. A surface roughness of 0.1 µm Ra or less allows the heat to be dissipated efficiently, and when this is 0.02 µm or less the heat can be dissipated even more efficiently, and thus this is preferable.

When the heat-emitting member of the chuck top produces heat, such as when probing at temperatures of 200° C., it is preferable that the temperature of the lower surface of the support member is 100° C. or less. When over 100° C., warping occurs in the drive system of the prober provided in the lower portion of the support member due to differences in thermal expansion coefficients, and this negatively impacts the precision of the drive system and causes problems such as misalignment during probing and knocking of the probe due to worse warping and parallelism, and does not allow the element to be evaluated accurately. When performing a measurement at room temperature after a measurement has been conducted at 200° C., it takes time to cool from 200° C. to room temperature and this lowers the throughput.

The Young's modulus of the chuck top preferably is at least 200 GPa. When the Young's modulus of the chuck top is less than 200 GPa, the load that is applied to the chuck top during probing causes warping in the chuck top, and thus noticeably worsens the degree of planarity and the parallelism of the chuck top upper surface. This in turn results in poor contact by the probing pins, and thus an accurate inspection cannot be conducted and may even lead to cracking in the wafer. For this reason, the Young's modulus of the chuck top is preferably at least 200 GPa and more preferably at least 250 GPa.

The thermal conductivity of the chuck top preferably is at least 15 W/mK. When less than 15 W/mK, the temperature distribution within the wafer resting on the chuck top becomes poor, and thus is not preferable. A thermal conductivity of at least 15 W/mK allows a sufficient degree of temperature uniformity for probing to be conducted without problem. An example of a material with such a thermal conductivity is 99.5% pure alumina (thermal conductivity 30 W/mK). A particularly preferable thermal conductivity is 170 W/mK or more. Examples of materials having such a thermal conductivity include aluminum nitride (170 W/mK) and Si—SiC composite (170 W/mK to 220 W/mK). A thermal conductivity of this magnitude allows the chuck top to have very excellent temperature uniformity.

The chuck top preferably is at least 8 mm thick. A thickness less than 8 mm will cause the chuck top to bend under the load that is applied to it during probing, and the noticeably poorer planarity and parallelism of the chuck top upper surface that occurs as a result will prevent accurate inspection due to poor contact of the probe pins and may even damage the wafer. Thus, the chuck top preferably is at least 8 mm, and more preferably at least 10 mm, thick.

The substance used to form the chuck top preferably is a metal-ceramic composite, a ceramic, or a metal. Preferable examples of the metal-ceramic composite include aluminum-silicon carbide composites, silicon-silicon carbide composites, and aluminum-silicon-silicon carbide composites, which have a relatively high thermal conductivity and easily allow uniform heating to be achieved when the wafer is heated. Of these, silicon-silicon carbide composites are particularly preferable due to their particularly high Young's modulus and high thermal conductivity.

These composite materials are conductive, and thus the heat-emitting member can be formed by providing an insulating layer on the surface on the side opposite the wafer resting surface through a method such as atomizing or screen printing, then screen printing a conducting layer or forming a conducting layer in a predetermined pattern using a method such as vapor deposition on top of this, forming the heat-emitting member.

It is also possible to form a predetermined heat producing material pattern by etching a metal foil of stainless steel, nickel, silver, molybdenum, tungsten, chrome, or an alloy of these to form the heat-emitting member. In the case of this method, the insulator between the heating member and the chuck top can be formed in the same way as above, or it can be provided by inserting an insulating sheet between the chuck top and the heat-emitting member. This approach is preferable because the insulating layer can be formed much less expensively and with greater ease than with the above method. Examples of resins that can be used in this case include epoxy resin, polyimide resin, phenolic resin, silicon resin, and mica sheet due to its heat-resistance. Of these, mica is particularly preferable. This is because it has excellent heat resistance and is an excellent electrical insulator, it can be processed easily, and it is inexpensive.

Ceramics are comparatively easy to use as the substance for the chuck top because they obviate the need to form an insulating layer as discussed above. When ceramics are used, the heat-emitting member can be formed using any of the methods discussed above. Particularly preferable ceramic materials include alumina, aluminum nitride, silicon nitride, mullite, and composites of mullite and alumina. These materials have comparatively high Young's moduli and deform little due to pressing by the probe card, and thus are particularly preferable. Of these, alumina is comparatively low cost and has excellent electrical properties at high temperatures, and thus is most favorable. Alumina that is at least 99.6% pure is an excellent insulator at elevated temperatures. Alumina that is 99.9% or more pure is particularly preferable. That is, when sintering the alumina substrate, generally oxides such as silicon and alkaline earth metals are added to lower the sintering temperature, but because this lowers the electrical properties, such as the electrical insulating properties, of pure alumina at high temperatures, it is preferable that the alumina purity is at least 99.6% and more preferably at least 99.9%.

It is also possible to adopt a metal as the material for the chuck top. In this case, it is possible to use tungsten, molybdenum, or alloys of these metals, which have particularly high Young's moduli. Specific examples of alloys include alloys of tungsten and copper and alloys of molybdenum and copper. These alloys can be fabricated by impregnating copper in tungsten or molybdenum. Since these metals are conductors like the ceramic-metal composites mentioned above, they can be used as the chuck top by forming the chuck top conducting layer and the heating member using the methods discussed above as they are.

It is preferable that the chuck top bends by 30 µm or less when a load of 3.1 MPa has been applied. The numerous pins of the probe card for inspecting the wafer push the wafer against the chuck top, and this force may affect the chuck top, too, and at a minimum bend the chuck top. When the chuck top bends more than 30 µm at this time, the probe card pins cannot press against the wafer uniformly and thus the wafer cannot be inspected, and this not preferable. The amount of bending that occurs due to this force more preferably is not more than 10 µm.

Figure 8:
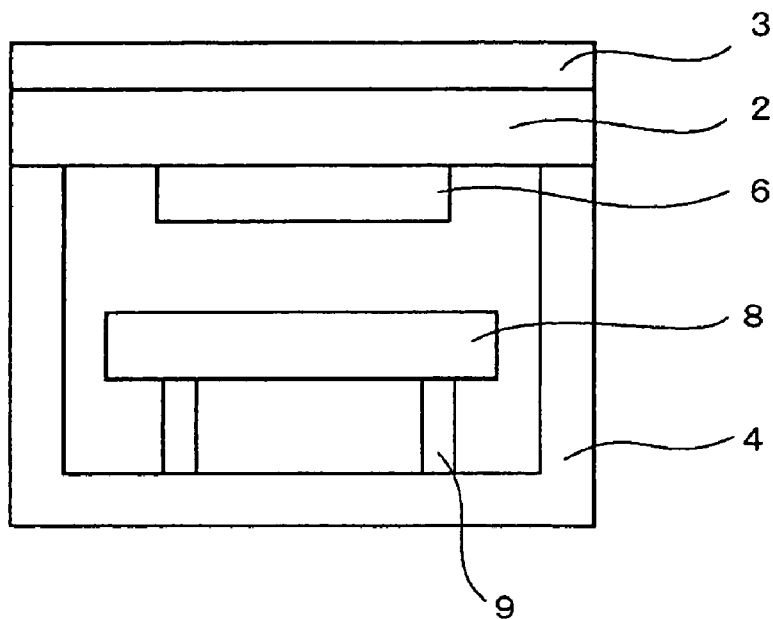
FIG. 8 illustrates yet another example of the cross-sectional structure of a wafer-prober wafer holder of the invention.

In this invention, as shown in FIG. 8, it is possible to provide a cooling module 8 in the cylinder portion of the support member 4. The cooling module removes heat from the chuck top when it is necessary to cool the chuck top, and thus can rapidly cool the chuck top. By keeping the cooling module away from the chuck top, when heating the chuck top the temperature of the chuck top can be raised efficiently, and thus preferably the cooling module can be moved. One method for moving the cooling module is to use a raising/lowering means 9 such as an air cylinder. Doing this allows the speed at which the chuck top is cooled to be raised significantly and increases the throughput, and thus is preferable. With this method, none of the force of the probe card is applied to the cooling module during probing, and thus the cooling module will not be deformed by this force, and the cooling module allows more rapid cooling t than air cooling, and thus is preferable.

Figure 9:
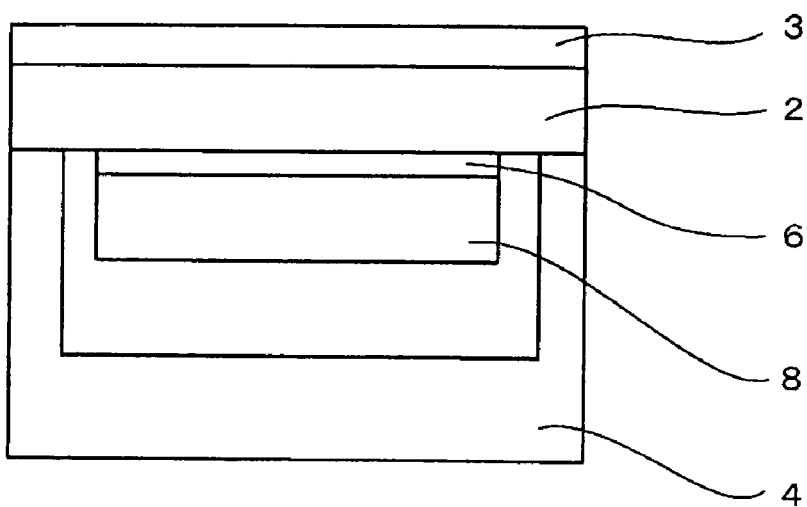
FIG. 9 illustrates still another example of the cross-sectional structure of a wafer-prober wafer holder of the invention.
Figure 10:
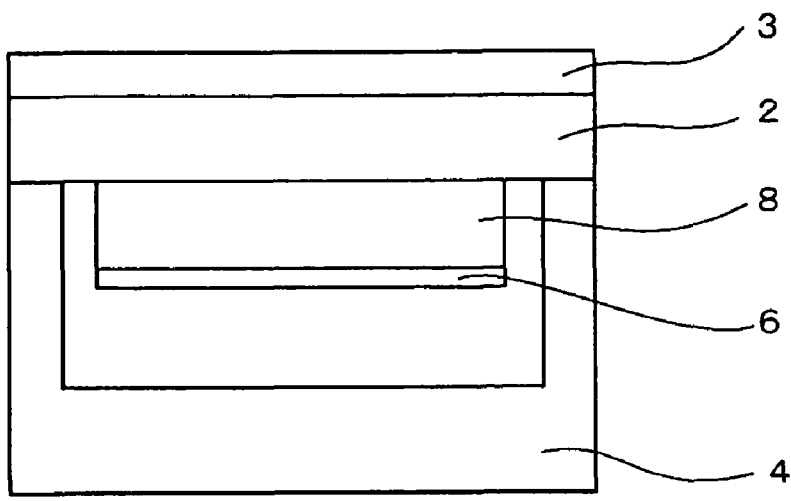
FIG. 10 illustrates a still further example of the cross-sectional structure of a wafer-prober wafer holder of the invention.

It is also possible to fasten the cooling module to the chuck top in order to maximize the speed at which it cools the chuck top. As shown in FIG. 9, the cooling module 8 can be fastened to the chuck top by arranging the heating member 6, whose structure is constituted by a resistance heat-emitting member sandwiched by insulating layers, on the side of the chuck top 2 that is opposite its wafer resting surface, and then fastening the cooling module 8 to the lower surface of the heating member 6. Another possibility, which is illustrated in FIG. 10, is to arrange the cooling module 8 directly on the side of the chuck top 2 that is opposite its wafer resting surface and then to fasten the heating member 6, whose structure has a resistance heat-emitting member sandwiched by insulating layers, to the lower surface of the cooling module 8. At this time, it is possible to insert a soft material that can be deformed, that is heat resistant, and that has high thermal conductivity, between the cooling module 8 and the side opposite the chuck top 2 wafer resting surface. Providing a soft material between the chuck top and the cooling module that can counterbalance warping and planarity discrepancies between the two allows the contact area to be widened and enhances the cooling module's inherent cooling ability, and thus can increase the speed at which cooling occurs.

Regardless of the fastening method, there are no particular limitations regarding fastening, and fastening also can be effected by mechanical means such as screws and clamps. If screws are used to fasten the chuck top and the cooling module and the insulated heater, then it is preferable that at least 3 screws, and more preferably 6 screws, are used because this increases the tightness of the connection between the two and increases the ability of the cooling module to cool the chuck top.

Further, in the case of this structure, it is also possible to adopt a configuration in which the cooling module is provided in the cavity of the support member or is provided on the support member and the chuck top is provided on top. In either case, the chuck top and the cooling member are fastened to one another, and thus the cooling speed is faster than in a case where the cooling module is movable. Providing the cooling module portion on the support member portion increases the contact area between the cooling module and the chuck top and thereby allows the chuck top to be cooled even more rapidly.

When the cooling module is fastened to the chuck top as above, it is also possible to raise the temperature by not passing a cooling medium through the cooling module. In this case, the cooling medium is not passed through the cooling module, and thus the heat that is generated by the heat-emitting member is not sequestered by the cooling medium and is allowed to escape to outside the system, and this allows the temperature to be raised more efficiently. Here, a cooling medium can be passed through the cooling module when cooling is to be performed to efficiently cool the chuck top.

It is also possible to provide the chuck top and the cooling module as an integral unit. In this case, there are no particular limitations regarding the materials for the chuck top and the cooling module when the two are provided in a single unit, but since it is necessary to form a conduit in the cooling module through which the cooling medium can pass, it is preferable that the thermal expansion coefficient difference between the chuck top portion and the cooling module portion is small, and of course, it is preferable that the two are the same material.

Examples of materials that may be used in this case include ceramics and composites of ceramic and metal, which were mentioned above as materials for the chuck top. In this case, the wafer holder can be fabricated by forming the chuck top conducting layer on the wafer resting surface side and forming the conduit for cooling on the opposite surface, and then integrally forming a substrate of the same material as the chuck top using a method such as brazing or glass attach. Of course, it is also possible to form the conduit in the substrate that is attached or in both substrates. Further, it is also possible to provide the two in a single unit using screws.

Providing the chuck top and the cooling module in a single unit in this manner allows the chuck top to be cooled faster than if the cooling module is fastened as discussed above.

Figure 11:
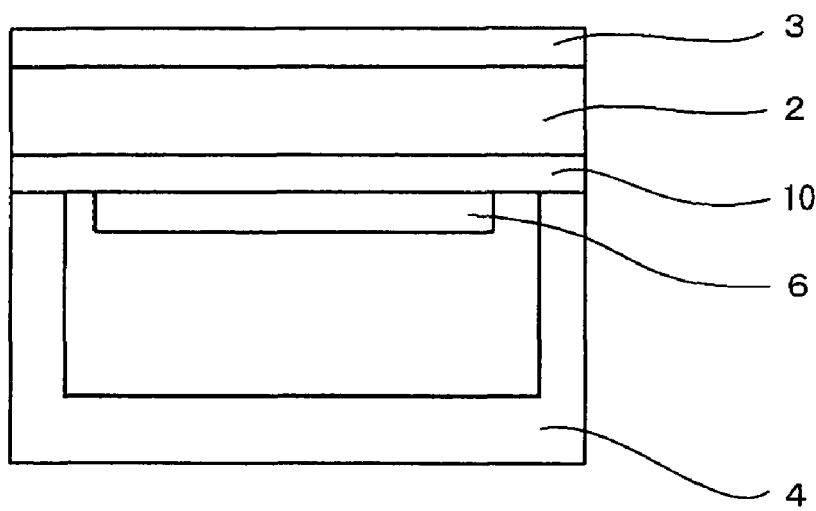
FIG. 11 illustrates a different example of the cross-sectional structure of a wafer-prober wafer holder of the invention.

This method also allows metal to be used as the material for the integrated chuck top. Metal is more easily processed and less expensive than ceramics or ceramic-metal composites, and thus the conduit for the cooling medium can be formed easily. However, when metal is used as the integrated chuck top, there is a chance that bending may occur due to the force that is applied during probing. For this reason, it is possible to prevent bending by disposing a chuck top deformation prevention substrate 10 on the side opposite the wafer resting surface of the integrated chuck top 2 as shown in FIG. 11.

Figure 12:
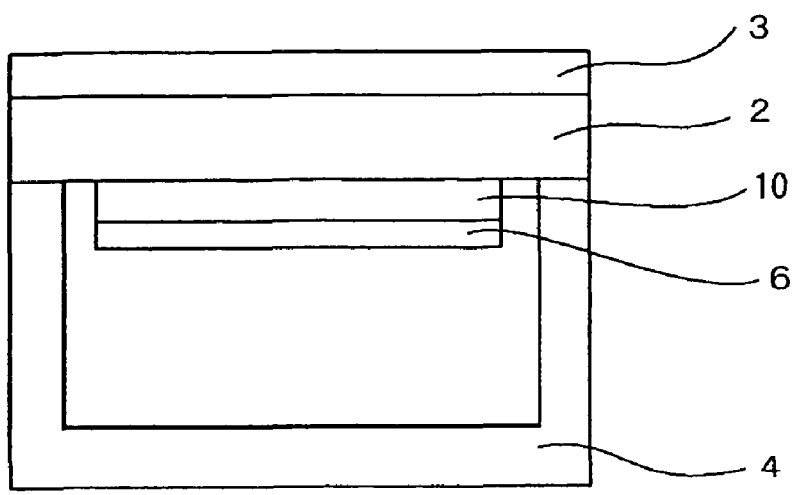
FIG. 12 illustrates a further example of the cross-sectional structure of a wafer-prober wafer holder of the invention.

A substrate whose Young's modulus is at least 250 GPa is preferably used as the chuck top deformation prevention substrate. This chuck top deformation prevention substrate, as shown in FIG. 12, can be accommodated within the cavity that is formed in the support member, or the chuck top deformation prevention substrate can be inserted between the integrated chuck top and the support member. The chuck top deformation prevention substrate and the integrated chuck top can be fastened to one another through a mechanical method such as using screws and through a method such as brazing with metal or glass attach. Like the above case in which the cooling module is fastened to the chuck top, it is also possible to stop the flow the cooling medium when the chuck top temperature is to be raised or maintained at an elevated temperature, and to allow the cooling medium to flow when cooling is performed, so as to more efficiently raise and lower the temperature, and thus this is preferable.

In an embodiment such as this in which the chuck top material is a metal, in cases where the surface of the chuck top material is oxidized or changed easily or its electrical conductivity is not high, it is possible to form a new chuck top conducting layer on the surface that functions as the wafer resting surface. Examples of methods that can be used for this include, as discussed above, forming a chuck top conducting layer by plating with a material that is resistant to oxidation, such as nickel, or a combination of this and atomizing, and then polishing the surface on which the wafer will be placed.

With this structure, if necessary it is also possible to form the electromagnetic shield layer and the guard electrode layer discussed above. In this case, the insulated heat-emitting member is covered by metal as discussed above and then a guard electrode layer is formed with an insulating layer therebetween and an insulating layer is formed between the guard electrode layer and the chuck top. Depending on the chuck top deformation prevention substrate, it is also possible to integrally fasten this to the chuck top.

With this structure, methods for arranging integrated chuck top with the cooling module on the support member of the include arranging the cooling module portion in the cavity portion formed in the support member and, like when the chuck top and the cooling module are fastened to one another with screws, it is possible to arrange the cooling module portion on the support member.

There are no particular limitations regarding the material of the cooling module, but aluminum, copper, and alloys thereof have comparatively high thermal conductivities and therefore can rapidly remove the heat of the chuck top, and thus are preferably used. Stainless steel and magnesium alloys, nickel, and other metal materials also can be used. To make the cooling module resistant to oxidation, it is also possible to form a metal film that is resistant to oxidation made of nickel, gold, or silver, for example, using a method such as plating or atomizing.

It is also possible to use ceramic materials for the cooling module. Although there are no particular limitations to the material in this case, preferably the material is aluminum nitride or silicon carbide because their comparatively high thermal conductivity allows them to quickly remove heat from the chuck top. Silicon nitride and aluminum oxynitride are preferable because of their good mechanical strength and their excellent durability. Ceramic oxides such as alumina, cordierite, and steatite are relatively inexpensive and therefore preferable. The material for the cooling module can be selected from a wide array of options, and thus the material can be selected according to the application. Of these, nickel-plated aluminum and nickel-plated copper both have excellent resistance to oxidation, have high thermal conductivity, and are relatively inexpensive, and thus are particularly preferable.

It is also possible for a cooling medium to be passed through the cooling module. By doing this, the heat that has been transferred to the cooling module from the heating member can be rapidly removed from the cooling module, and thus the speed at which the heating member is cooled increases, and thus this is preferable. Possibilities for the cooling medium that is passed through the cooling module include water and Fluorinert™, and although there are no particular limitations, water is most preferable for cost considerations and its high specific heat.

In an advantageous example, two aluminum sheets are prepared, and one of those aluminum sheets is mechanically processed to form a conduit through which water is passed. To increase its ability to resist corrosion and oxidation, its front surface is subjected to nickel plating. The other aluminum sheet also is subjected to nickel plating, and the two are brought together. An O-ring or the like is inserted around the conduit to prevent water from leaking, and then the two aluminum sheets are screwed or welded together.

It is also possible to prepare two copper sheets (oxygen-free copper) and then mechanically provide one of those copper sheets with a water conduit. The other copper sheet and a pipe made of stainless steel to serve as the entrance and exit for the cooling medium are simultaneously soldered together. To increase the fused cooling plate's ability to resist corrosion and oxidation, its entire surface is plated with nickel. In another implementation, the cooling module can be achieved by attaching a pipe through which the cooling medium can pass to an aluminum or copper cooling sheet. In this case, a recessed groove close in shape to the cross-sectional shape of the pipe can be formed in the cooling sheet so that the pipe adheres tightly, which further increases the cooling efficiency. It is also possible to insert a heat conducting resin or ceramic as an interposed layer in order to make the cooling pipe and the cooling sheet adhere more tightly.

The wafer-prober wafer holder of the invention can be favorably used for heating and inspecting processed objects such as wafers. For example, the wafer-prober wafer holder can be favorably employed in wafer probers, handler devices, and testing devices because such applications exploit its properties, that is, high stiffness and high thermal conductivity, particularly well.

First Embodiment

Two alumina substrates 99.5% pure, 310 mm diameter, and 15 mm thickness were prepared. Concentric circular grooves serving as a vacuum chuck for the wafer, and through-holes, were formed in the wafer resting surface of the alumina substrates, and each wafer resting surface was subjected to nickel plating, forming a chuck top conducting layer. The chuck top conducting layer was polished to adjust the overall warp amount to 10 µm, and the surface roughness to 0.02 µm Ra, producing the chuck top.

Next, two cylindrical mullite-alumina composites 310 mm in diameter and 40 mm thick were prepared as support members. One of these was counter-bored with a recess having an inner diameter of 295 mm and a 20 mm depth. A stainless steel foil insulated by silicon resin sheets was attached to each chuck top as an electromagnetic shield electrode layer, and then a heat-emitting member sandwiched by silicon resin sheets was attached. The heating member was obtained by etching stainless steel foil with a predetermined pattern. The support members were provided with through-holes for connecting the electrodes for supplying power to the heating member.

Next, the chuck tops, to which the heating member and the electromagnetic shield electrode layer have been attached, were placed on the support members, thereby producing wafer holders for wafer prober.

Power was supplied to the heat-emitting member of the two wafer holders for wafer prober to heat a wafer to 150° C., and probing was conducted continuously. The wafer prober wafer holder whose support member was counter-bored did not have any problems after ten hours of continuous probing, whereas in the one not counter-bored, after two hours warping occurred in its chuck top and the probing pins knocked, keeping probing from being carried out further.

For the sake of comparison, the stainless steel foil, which is the electromagnetic shield electrode layer of the chuck top, was removed from the wafer-prober wafer holder whose support member was counter-bored and then probing was conducted, and it was found that noise that is likely generated from the heat-emitting member did not permit good measurement of the wafer properties.

Second Embodiment

The same wafer-prober wafer holder as that of Embodiment 1 in which the support member was counter-bored was prepared, except that a metal layer was formed on the lateral surface and the bottom surface of the support member though nickel plating and a stainless steel foil insulated by silicon resin sheet was disposed as a guard electrode between the chuck top and the electromagnetic shield electrode layer and connected to the metal layer on the lateral surface of the support member. Like in Embodiment 1, a wafer was heated to 150° C. and probing was conducted, and no problems occurred after 10 continuous hours of probing.

Probing was conducted continuously for ten hours using a wafer holder in which the metal layer of the support member was not plated but rather was a stainless steel metal foil that was screwed to the lateral surface and the bottom surface of the support member, and then the guard electrode and the stainless steel foil on the support member lateral surface were connected, and no problems occurred in this case either.

For the sake of comparison, the metal layer of the support member was removed and probing conducted, and under the conditions of Embodiment 1 no problems occurred after ten hours of continuous probing, however, when probing was conducted for high frequencies, the effects of noise kept probing from being conducted favorably.

Third Embodiment

The same wafer-prober wafer holder as that of Embodiment 1 was prepared, except that Si—SiC was used as the material for the chuck top. Probing was conducted as in Embodiment 1, and the exact same outcome was obtained.

Fourth Embodiment

Two cylindrical mullite-alumina composites 310 mm in diameter and 40 mm thick were prepared as support members, and 30 mm diameter through-holes were formed at a 40 mm pitch in one, whereas recesses 30 mm in diameter and 20 mm depth were formed at a 40 mm pitch in the other. The chuck top of Embodiment 3 was placed on these support members and probing was carried out as in Embodiment 1, and in both cases excellent probing was possible.

Fifth Embodiment

Substrates made of the materials shown in Table I at a 310 mm diameter and 15 mm thickness were prepared, provided with concentric circular grooves and through-holes like in Embodiment 1, nickel plated, to form a chuck top conducting layer, and processed to adjust their overall warp amount to 10 μm and their surface roughness to 0.02 μm Ra.

TABLE I

| Material | Thermal conductivity (W/mK) | Young's modulus (GPa) |
| --- | --- | --- |
| Tungsten | 170 | 380 |
| Molybdenum | 160 | 320 |
| 90% tungsten - 10% copper | 180 | 330 |
| 80% tungsten - 20% copper | 200 | 280 |
| 85% molybdenum - 15% copper | 160 | 280 |

Next, two cylindrical mullite-alumina composites 310 mm in diameter and 40 mm thick were prepared as support members. One of these was counter-bored having an inner diameter of 295 mm and a 20 mm depth. A stainless steel foil insulated by a silicon resin sheet was attached to each chuck top as an electromagnetic shield layer, and then a heat-emitting member sandwiched by polyimide was attached. The heat-emitting member was obtained by etching stainless steel foil with a predetermined pattern. The support members were provided with through-holes for connecting the electrode for supplying power to the heat-emitting member. Next, aluminum was atomized to form a metal layer on the lateral surface and the bottom surface of these support members.

Next, the chuck tops to which the heat-emitting member and the electromagnetic shield layer have been attached were placed on the support members to form wafer holders for wafer prober.

Power was supplied to the heat-emitting member of these two wafer holders for wafer prober to heat a wafer to 150° C., and probing was conducting in a continuous manner. All substrates whose support member had been counter-bored did not demonstrate any problems after ten hours of continuous probing, whereas in each of those that had not been counter-bored, after four hours warping had occurred in the chuck top and the probing pins knocked, preventing probing from being carried out further.

Sixth Embodiment

The same chuck top as in Embodiment 3 was prepared. Support members composed of the materials shown in Table II were counter-bored like in Embodiment 1, a heat-emitting member and an electromagnetic shield layer were attached to the chuck top like in Embodiment 1, and the support members were provided with a atomized electromagnetic shield layer like in Embodiment 1 and the chuck tops were placed on these, producing wafer holders for wafer prober.

Power was supplied to the heat-emitting member of these wafer holders for wafer prober to heat the wafers to 200° C., and an initial evaluation was performed and those for which probing could be carried out favorably over the entire wafer surface were assigned an empty circle and those for which probing was poor even locally were assigned an "x", and then those for which probing was favorable were further subjected to 24 hours of continuous probing, and those there were favorable were assigned a double circle and those that were unfavorable were assigned an "x", in Table II.

TABLE II

| Support member substance | Thermal conductivity (W/mK) | Young's modulus (GPa) | Initial evaluation | 24-hour evaluation |
| --- | --- | --- | --- | --- |
| Alumina-1 | 30 | 390 | ○ | ◎ |
| Alumina-2 | 28 | 370 | ○ | ◎ |
| Alumina-3 | 24 | 320 | ○ | ◎ |
| Mullite | 1.7 | 200 | ○ | ◎ |
| Mullite-alumina composite 1 | 4 | 250 | ○ | ◎ |
| Mullite-alumina composite 2 | 8 | 220 | ○ | ◎ |
| Cordierite | 4 | 140 | X | — |
| Steatite | 2 | 120 | X | — |
| AlN | 150 | 320 | ○ | X |
| $Si_3N_4$ | 20 | 300 | ○ | ◎ |
| SiC | 60 | 400 | ○ | X |
| Cu | 390 | 120 | X | — |
| Stainless steel-1 | 16 | 210 | ○ | ◎ |
| Stainless steel-2 | 15 | 250 | ○ | ◎ |
| Aluminum | 236 | 70 | X | — |
| Duralumin | 137 | 90 | X | — |

From Table II it can be understood that the thermal conductivity of the support member preferably is 40 W/mK or less, and its Young's modulus preferably is at least 200 GPa.

Seventh Embodiment

The wafer holders for wafer prober having the alumina-1, stainless steel-1, and mullite-alumina composite support members of Embodiment 6 were prepared. However, instead of providing the support member with a recessed inner diameter, the thickness of its cylinder portion was changed to the values shown in Table III. An electromagnetic shield layer was atomized like in Embodiment 1, and then a heat-emitting member and an electromagnetic shield layer were attached to the chuck top like in Embodiment 1 and this was placed on the support member, producing wafer holders for wafer prober. Probing was carried out for 24 hours as in Embodiment 2 using these wafer holders for wafer prober. The results are shown in Table III.

TABLE III

| Cylinder portion thickness (mm) | Alumina-1 | Stainless steel-2 | Mullite-alumina |
|---|---|---|---|
| 2.5 | Damage | Deformation | Deformation |
| 3 | ⊚ | Deformation | Deformation |
| 3.5 | ⊚ | Deformation | ⊚ |
| 5 | ⊚ | ⊚ | ⊚ |
| 7.5 (Embodiment 6) | ⊚ | ⊚ | ⊚ |
| 12.5 | ⊚ | ⊚ | ⊚ |
| 15 | ⊚ | ⊚ | ⊚ |
| 20 | ⊚ | ⊚ | ⊚ |
| 25 | X | X | ⊚ |
| 30 | X | X | X |

The above results illustrate that the cylinder portion thickness preferably is not more than 20 mm. Those whose support members had a low thermal conductivity had good probing ability even when the thickness was large. Probing was possible with materials having a high Young's modulus even when the thickness was small. It should be noted that a atomized film was not formed on the stainless steel-2 support member.

Eighth Embodiment

The same wafer holders for wafer prober as those of Embodiment 7 were prepared, except that the support member bottom portion was given the thicknesses shown in Table IV instead of the recess depth. These wafer holders for wafer prober were subjected to probing like in Embodiment 2 for 24 hours. The results are shown in Table IV.

TABLE IV

| Bottom portion thickness (mm) | Alumina-1 | Stainless steel-2 | Mullite-alumina |
|---|---|---|---|
| 8 | Damage | Deformation | Damage |
| 9 | ⊚ | Deformation | ⊚ |
| 10 | ⊚ | ⊚ | ⊚ |
| 15 | ⊚ | ⊚ | ⊚ |
| 20 | ⊚ | ⊚ | ⊚ |

From Table IV it can be understood that the thickness of the support member bottom portion preferably is at least 10 mm.

Ninth Embodiment

The same wafer holders for wafer prober as in Embodiment 7 were prepared, except that the surface of the support member in contact with the chuck top was provided with 2 mm deep, 2 mm wide grooves at a 2 mm pitch from its outer circumference. These wafer holders for wafer prober were subjected to probing like in Embodiment 2 for 24 hours. The results are shown in Table V. It should be noted that the thickness of the cylinder portion of the support member was set to 25 mm.

TABLE V

| Support member configuration | Alumina-1 | Mullite-alumina | SiC |
|---|---|---|---|
| Without grooves | ⊚ | ⊚ | X |
| With grooves | ⊚ | ⊚ | ⊚ |

Regardless of the support member material, providing grooves reduced the amount of heat that is transferred to the support member, and thus was understood that it was possible to conduct favorable probing.

Tenth Embodiment

The same wafer holders for wafer prober as those of Embodiment 6 were prepared. However, the support members were made of mullite-alumina, and cylinders of 10 mm diameter, 2 mm thickness made of alumina, Si—SiC, or glass resin composite were evenly placed between the chuck top and the support member as columnar portions in the number listed in Table VI. These wafer holders for wafer prober were subjected to probing as in Embodiment 2 for 24 hours. The results are shown in Table VI. It should be noted that the thickness of the cylinder portion of the support member was set to 25 mm.

TABLE VI

| | Column material | | | | | |
|---|---|---|---|---|---|---|
| | Alumina | | Si—SiC | | Glass-resin composite | |
| Column number | Initial result | 24-hour result | Initial result | 24-hour result | Initial result | 24-hour result |
| 0 | ⊚ | X | ⊚ | X | ⊚ | X |
| 3 | X | — | X | — | X | — |
| 6 | ⊚ | ⊚ | ⊚ | X | X | — |
| 8 | ⊚ | ⊚ | ⊚ | X | ⊚ | ⊚ |
| 12 | ⊚ | ⊚ | ⊚ | X | ⊚ | ⊚ |
| 16 | ⊚ | ⊚ | ⊚ | X | ⊚ | ⊚ |
| 32 | ⊚ | ⊚ | ⊚ | X | ⊚ | ⊚ |
| 48 | ⊚ | ⊚ | ⊚ | X | ⊚ | ⊚ |
| 64 | ⊚ | ⊚ | ⊚ | X | ⊚ | ⊚ |

When the cylinders are inserted, it is clear that the temperature of the lower portion of the support member does not rise easily. When there are three and six columns, knocking occurs easily. The same results as these are obtained when the columnar components are triangular or rectangular columns.

Eleventh Embodiment

The same wafer holders for wafer prober as in Embodiment 1 were prepared. However, the chuck tops were either the alumina-1 or the composite of silicon and silicon carbide (Si—SiC) of Embodiment 6. Additionally, the thickness of the chuck tops was changed as shown in Table VII. A 10 mm diameter column of the same material as the support member was attached to a central portion of the support member as a support post. These wafer holders for wafer prober were subjected to probing as in Embodiment 2 for 24 hours. The results are shown in Table VII.

TABLE VII

| | Alumina-1 | | Si—SiC | |
|---|---|---|---|---|
| Chuck top thickness (mm) | With support post | Without support post | With support post | Without support post |
| 15 | ⊚ | ⊚ | ⊚ | ⊚ |
| 12 | ⊚ | ⊚ | ⊚ | ⊚ |
| 10 | ⊚ | ⊚ | ⊚ | ⊚ |
| 8 | ⊚ | ⊚ | ⊚ | ⊚ |
| 6 | ⊚ | Damage | ⊚ | Damage |

Attaching the support post makes it possible to keep the chuck top from deforming, and thus probing is possible with a thinner chuck top, and this allows a more lightweight prober to be achieved. It is also clear that it is necessary for the thickness of the chuck top to be at least 8 mm.

For the sake of comparison, the material of the support post was changed to a composite of aluminum and silicon carbide, which has a larger thermal expansion coefficient (thermal expansion coefficient of $10 \times 10^{-6}/°$ C.) than alumina-1, and with the chuck top thickness at 10 mm, the chuck top temperature was raised to 150° C., and some unevenness occurred in the chuck top and it was not possible to conduct probing well.

Twelfth Embodiment

The same wafer holders for wafer prober whose support member has been counter-bored like in Embodiment 3 were prepared. However, the warping of the chuck top was made larger than the 10 μm of Embodiment 1 as shown in Table VIII. Probing was performed for 10 hours as in Embodiment 1, and the results are shown in Table VIII.

TABLE VIII

| Warpage (μm) | Result |
| --- | --- |
| 10 | Good |
| 20 | Good |
| 30 | Good |
| 50 | Pins occasionally did not contact wafer |
| >100 | Wafer damaged |

From these results it is clear that it is necessary for the amount of warping in the surface of the chuck top on which the wafer is placed to be 30 μm or less.

Thirteenth Embodiment

The same wafer holders for wafer prober whose support member has been counter-bored as in Embodiment 1 were prepared. However, the surface roughness of the chuck top conducting layer surface was changed from an Ra of 0.02 μm as in Embodiment 1 to the values shown in Table IX. Probing was performed for 10 hours in the same manner as in Embodiment 1, and the results are shown in Table IX.

TABLE IX

| Ra (μm) | Result |
| --- | --- |
| 0.01 | Good |
| 0.02 | Good |
| 0.05 | Good |
| 0.10 | Good |
| 0.2 | Fairly good |
| 0.5 | No good |

From these results it can be understood that the surface roughness of the chuck top conducting layer preferably is 0.1 μm Ra or less.

Fourteenth Embodiment

The same wafer holders for wafer prober whose support member has been counter-bored as in Embodiment 1 were prepared. However, the materials adopted for the chuck top are shown in Table X. Aside from the material of the chuck top, the support member was counter-bored as in Embodiment 1, and probing was performed for 24 hours in the same manner as in Embodiment 6. The result of this is shown in Table X, where the range of the wafer surface temperature distribution at 200° C. within 3° C. is denoted by a double circle, within 4° C. is denoted by an empty circle, within 6° C. is denoted by an empty triangle, and greater than 6° C. is denoted by an "x." It should be noted that in the table, Si—SiC indicates a composite of silicon and silicon carbide and Al—SiC indicates a composite of aluminum and silicon carbide, and in each case the SiC ratio has been adjusted to alter the Young's modulus.

TABLE X

| Test | Temperature (° C.) | Distance from center (PCD · mm) | Warpage (μm) | Probing result |
| --- | --- | --- | --- | --- |
| 1 | Room temperature | 0 | 8 | ⊚ |
| 2 | Room temperature | 180 | 20 | ○ |
| 3 | Room temperature | 280 | 25 | ○ |
| 4 | −40 | 0 | 10 | ⊚ |
| 5 | −40 | 180 | 30 | X |
| 6 | −40 | 280 | 35 | X |
| 7 | 200 | 0 | 10 | ⊚ |
| 8 | 200 | 180 | 35 | X |
| 9 | 200 | 280 | 40 | X |

From these results it can be understood that the material for the chuck top preferably has a Young's modulus of at least 200 GPa and more preferably at least 250 GPa. With the Al—SiC-1 material, which has a Young's modulus of 265 GPa, the temperature distribution in the wafer surface was within 1° C., and thus probing could be conducted particularly well. With the Al—SiC-2 material, which has a Young's modulus of 200 GPa, as well, the surface temperature distribution was within 1° C.

Fifteenth Embodiment

The same holding members for wafer prober whose support member has been counter-bored as in Embodiment 1 were prepared. However, the materials adopted for the chuck top are shown in Table XI. Aside from the material of the chuck top, the support member was counter-bored as in Embodiment 1, and probing was performed continuously for 10 hours at 150° C. as in Embodiment 1. The results are shown in Table XI. The results of probing at room temperature (25° C.) also are shown. It should be noted that the volume resistivity of the materials at room temperature (25° C.) and at 150° C. also are shown. As for the markings in the table, a double circle indicates that evaluation could be conducted very favorably, an empty circle indicates that evaluation could be performed favorably, an empty triangle indicates that the presence of noise did not allow evaluation in some cases, and a x indicates that the presence of noise did not allow evaluation.

TABLE XI

| Material | Purity (%) | Volume resistivity at room temperature (Ω · cm) | Volume resistivity at 150° C. (Ω · cm) | Probing result at room temperature | Probing result at 150° C. |
| --- | --- | --- | --- | --- | --- |
| Alumina-1 | 95 | $10^{14}$ | $10^{10}$ | ○ | Δ |
| Alumina-2 | 99 | $10^{14}$ | $10^{10}$ | ⊚ | Δ |
| Alumina-3 | 99.2 | $10^{14}$ | $10^{11}$ | ⊚ | Δ |
| Alumina-4 | 99.5 | $10^{14}$ | $10^{13}$ | ⊚ | Δ |
| Alumina-5 | 99.6 | $10^{14}$ | $10^{14}$ | ⊚ | ○ |

TABLE XI-continued

| Material | Purity (%) | Volume resistivity at room temperature (Ω·cm) | Volume resistivity at 150° C. (Ω·cm) | Probing result at room temperature | Probing result at 150° C. |
|---|---|---|---|---|---|
| Alumina-6 | 99.9 | $10^{15}$ | $10^{14}$ | ◎ | ◎ |
| Alumina-7 | 99.99 | $10^{15}$ | $10^{14}$ | ◎ | ◎ |
| AlN 1 | 95 | $10^{14}$ | $10^{11}$ | ○ | Δ |
| AlN 2 | 99 | $10^{15}$ | $10^{12}$ | ○ | Δ |

The above results indicate that alumina and AlN also are favorable materials for the insulated chuck top at room temperature. However, it is clear that when the temperature has been raised to 150° C., alumina at least 99.6% pure is necessary. A purity of at least 99.9% is particularly favorable.

Sixteenth Embodiment

The same wafer holders for wafer prober whose support member has been counter-bored as in Embodiment 3 were prepared. A probing test was conducted over a temperature range of −40° C. to 200° C., applying a load of 3.1 MPa. The results are shown in Table XII. The amount of warping in the chuck top conducting layer at the distance away from the center of the chuck top shown in the table also was measured.

TABLE XII

| Test | Temperature (° C.) | (PCD · mm) | Warpage (μm) | Probing result |
|---|---|---|---|---|
| 1 | Room temp. | 0 | 4 | ◎ |
| 2 | Room temp. | 180 | 8 | ◎ |
| 3 | Room temp. | 280 | 8 | ◎ |
| 4 | −40 | 0 | 7 | ◎ |
| 5 | −40 | 180 | 11 | ◎ |
| 6 | −40 | 280 | 12 | ◎ |
| 7 | 200 | 0 | 7 | ◎ |
| 8 | 200 | 180 | 16 | ◎ |
| 9 | 200 | 280 | 15 | ◎ |

For the sake of comparison, the same wafer holders for wafer prober as in Embodiment 16 were prepared, except that aluminum was used as the chuck top material, and were evaluated in the same manner as in Embodiment 16. The results are shown in Table XIII.

TABLE XIII

| Test | Temperature (° C.) | (PCD · mm) | Warpage (μm) | Probing result |
|---|---|---|---|---|
| 1 | Room temp. | 0 | 8 | ◎ |
| 2 | Room temp. | 180 | 20 | ○ |
| 3 | Room temp. | 280 | 25 | ○ |
| 4 | −40 | 0 | 10 | ◎ |
| 5 | −40 | 180 | 30 | X |
| 6 | −40 | 280 | 35 | X |
| 7 | 200 | 0 | 10 | ◎ |
| 8 | 200 | 180 | 35 | X |
| 9 | 200 | 280 | 40 | X |

Regardless of the measurement temperature, it is necessary for the warping of the chuck top to be 30 μm or less also when the load is applied. More preferably this is 20 μm or less.

Seventeenth Embodiment

The same holding members for wafer prober whose support member has been counter-bored as in Embodiment 3 were prepared. A cooling module made of copper and internally provided with a water conduit was placed within the support member, and when raising the temperature of the chuck top and when maintaining it at an elevated temperature, the cooling module was fastened to a lower portion of the support member, and when cooling the chuck top, the cooling module was brought into contact with the chuck top by an air cylinder and cooled the chuck top. When the cooling module was not present, it took 35 minutes for the chuck top to cool from 150° C. to 100° C. However, when the cooling module was pressed against the chuck top, cooling required 12 minutes, and when 20° C. water was passed through the cooling module at a rate of 1 liter min$^{-1}$, it was possible to cool the chuck top in 4 minutes.

When the temperature of the chuck top was raised to 150° C. while the cooling module, through which water flowed, was up against the chuck top, it took 35 minutes to heat from room temperature to 150° C., whereas when the cooling module was disposed at a lower portion of the support member and not in contact with the chuck top, it was possible to raise to temperature to 150° C. in 10 minutes. Based on this, it clear that a movable cooling module allows the time required to raise and lower the temperature of the chuck top to be reduced.

Eighteenth Embodiment

The same wafer-prober wafer holder whose support member has been counter-bored as in Embodiment 3 was prepared. A cooling module made of copper and internally provided with a water conduit was placed within the support member, and when raising the temperature of the chuck top and when maintaining it at an elevated temperature, the cooling module was fastened to a lower portion of the support member, and when cooling the chuck top, a comparison of the cooling capacity was made between a case where the cooling module is brought into contact with the chuck top by an air cylinder and a case of fastening the cooling module to the rear surface of the chuck top using screws. FIG. 8 shows a case where an air cylinder is used, in which the heating member 6, which is constituted by a resistance heat-emitting member sandwiched by an insulator, is fastened to the rear surface of the chuck top 2. FIG. 9 shows a case where the cooling module 8 is fastened to the chuck top 2, in which the heating member 6, which is constituted by a resistance heat-emitting member sandwiched by an insulator, is disposed between the chuck top and the cooling module and fastened together with the cooling module with screws. As a further example, a structure in which the heating member, which is constituted by a resistance heat-emitting member sandwiched by an insulator, is arranged at a lower portion of the cooling module and fastened with screws together with the cooling module. In each case, six screws were disposed on a same circumference at a 60° spacing. The structures that were obtained allowed the temperature to be raised and lowered.

At high temperatures, the cooling medium was not passed through the cooling module, and only when cooling was to be conducted was the cooling medium, whose water temperature was regulated by a chiller, allowed to flow for cooling. At this time, when the cooling module was not present, it took more than one hour for the chuck top to cool from 150° C. to 25° C. However, when the cooling module was pressed against the chuck top by the cylinder, the chuck top could be cooled in 20 minutes, and when the cooling module was fastened with screws, the structure in which the heat-emitting member is sandwiched by the cooling module required 10 minutes to cool and the structure in which the heating member is attached to a lower portion of the cooling module required 8 minutes to cool. If 25° C. air is passed through the water conduit at 100 l/min, then when the cooling module has been pressed by the cylinder the cooling time is 50 minutes, and when the cooling module has been fastened with screws, the structure in which the heat-emitting member is sandwiched by the cooling module required 40 minutes to cool and the structure in which the heat-emitting member is attached to a lower portion of the cooling module required 35 minutes to cool.

Nineteenth Embodiment

The same wafer-prober wafer holder whose support member has been counter-bored as in Embodiment 3 was prepared. A cooling module made of copper and internally provided with a water conduit was placed within the support member, and when raising the temperature of the chuck top and when maintaining it at an elevated temperature, the cooling module was fastened to a lower portion of the support member, and when cooling the chuck top, a comparison of the cooling capacity was made between a case where the cooling module is brought into contact with the chuck top by an air cylinder and a case of fastening the cooling module to the rear surface of the chuck top using screws. Like in Embodiment 18, when an air cylinder is used, the heating member 6, which is constituted by a resistance heat-emitting member sandwiched by an insulator, is fastened to the rear surface of the chuck top. FIG. 10 shows a case where the cooling module is fastened to the chuck top, in which the heating member 6, which is constituted by a resistance heat-emitting member sandwiched by an insulator, is arranged below the cooling module 8 and fastened with screws together with entire cooling module. The structures that were obtained allowed the temperature to be raised and lowered. At high temperatures, the cooling medium was not passed through the cooling module, and only when cooling was to be conducted was the cooling medium, whose water temperature was maintained by a chiller, allowed to flow for cooling. At this time, when the cooling module was not present, it took more than one hour for the chuck top to cool from 150° C. to 25° C. However, when the cooling module was pressed by the cylinder, the chuck top could be cooled in 20 minutes, and when the cooling module was fastened with screws, cooling could be achieved in 10 minutes. Further, a unit having the same structure as that discussed above except that the diameter of the cooling module is identical to the chuck top, was placed on the support member and the cooling speed was measured in the same manner as above. The result was that cooling could be achieved in 8 minutes. Further, when 25° C. air was passed through the water conduit at 100 l/min, the cooling time was 50 minutes for the cooling module pressed by the cylinder, and 40 minutes for the cooling module fastened with screws.

Twentieth Embodiment

A mullite-alumina composite support member that has been counter-bored like in Embodiment 1 was prepared. Two copper plates 310 mm in diameter and 5 mm thick were prepared as the material for the integral chuck top and cooling module. Next, grooves for vacuum adhesion of the wafer and through-holes were formed in one of the copper plates. In the other copper plate, grooves for the cooling medium to flow through were provided, and then the two were joined by welding, forming a chuck top that is integral with the cooling module.

The entire chuck top surface that was obtained was nickel plated to 20 μm, and then its surface on which the wafer rests was processed to a surface roughness of Ra 0.02 μm. As shown in FIG. 11, a heat-emitting member 6 made of stainless steel foil sandwiched by silicon resin sheets like in Embodiment 1, and a stainless steel foil for an electromagnetic shield, which is not shown, were prepared and these were screwed to the chuck top 2 along with a 99.5% pure, 5 mm thick, 310 mm diameter alumina substrate 10 for preventing chuck top deformation, and this was placed on the mullite-alumina composite support member 4, forming the wafer-prober wafer holder. It should be noted that here the nickel plating is the chuck top conducting layer 3. Next, a wafer was placed on this wafer holder and electricity was supplied to the heat-emitting member to hold the temperature of the wafer at 150° C. Power to the heat-emitting member was then stopped, and cooling was started by sending a cooling medium, whose water temperature was maintained by a chiller, to the cooling module portion. As a result, it was possible to cool the wafer to 25° C. within 7 minutes, thus allowing cooling to be carried out faster than in Embodiment 17. Further, when 25° C. air was passed through the water conduit at 100 L min$^{-1}$, the cooling time was 50 minutes for the cooling module pressed by the cylinder, and 40 minutes for the cooling module fastened with screws.

The cooling speed was measured for a case in which a substrate for preventing chuck top deformation is not provided, as in FIG. 1. In this case, the lack of a substrate for preventing deformation allowed the cooling speed to increase, and it was possible to achieve cooling in 5 minutes. However, the chuck top is deformed when the pressure that is applied to the wafer by the probe card becomes high, and thus it is necessary to adjust the pressure that is applied to the chuck top while conducting probing.

As shown in FIG. 12, it is also possible to set the diameter of the substrate 10 for preventing chuck top deformation to 293 mm and then to insert this substrate into the cavity within the support member 4. In this case as well, it was possible to cool the wafer within 7 minutes like above. The cooling speed was also measured in a case where the diameter of the substrate for preventing chuck top deformation was set to 310 mm. It was found that, like above, the wafer can be cooled in 7 minutes.

Twenty-First Embodiment

Using the Si—SiC-1 of Embodiment 14, Si—SiC-1 substrates of 310 mm diameter and 10 mm thickness were prepared. Concentric circular grooves for vacuum chuck of the wafer, and through-holes, were provided in the wafer resting surface of the Si—SiC-1 substrates, and each wafer resting surface was nickel plated, forming a chuck top conducting layer. Next, the chuck top conducting layer was polished to an overall warp amount of 10 μm and a surface roughness Ra of 0.02 μm, producing the chuck top.

Next, a cylindrical mullite-alumina composite 310 mm diameter and 40 mm thickness was prepared as the support member. This support member was counter-bored having a 295 mm inner diameter and 20 mm depth. A metal layer was formed on the lateral surface and the bottom surface of the support member by atomizing aluminum.

Figure 13:
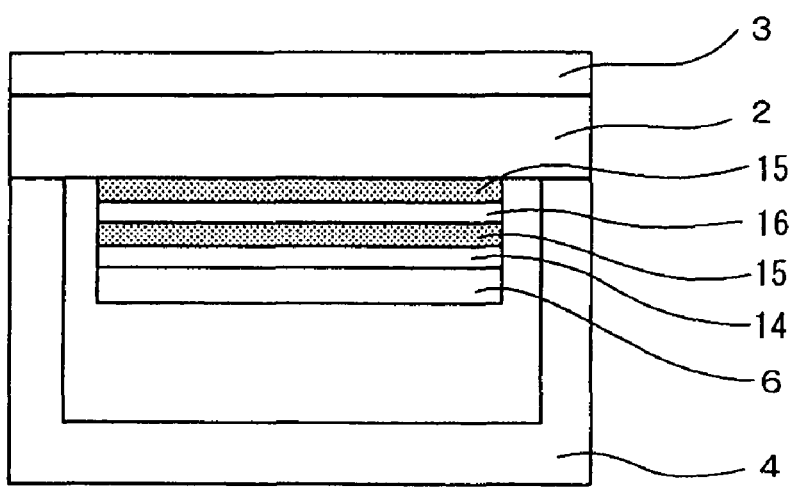
FIG. 13 illustrates a yet further example of the cross-sectional structure of a wafer-prober wafer holder of the invention.

As shown in FIG. 13, stainless steel foil is attached to the chuck top to as the electromagnetic shield layer 14 and the guard electrode layer 16, and using an insulating layer 15 of a material shown in Table XIV, the guard electrode layer and the electromagnetic shield layer, and the guard electrode layer and the chuck top, were insulated from one another. The guard electrode was connected to the metal layer of the support member. A heat-emitting member 6 sandwiching by a material in Table XIV was attached. The heat-emitting member was obtained by etching stainless steel foil with a predetermined pattern. Through-holes for connecting to an electrode for supplying power to the heat-emitting member were formed in the support member.

equivalent to a case where an insulating layer is not present, an empty triangle indicates that although the temperature response properties are slightly poor, probing itself is possible, and an "x" indicates that the temperature response properties are poor and negatively affect probing.

TABLE XIV

| | Insulating layer | | | | | Routine probing results | High RF probing results | Temp. control properties |
|---|---|---|---|---|---|---|---|---|
| Substance | Dielec. Const. | Thermal cond. (W/mK) | Thickness (mm) | Cap. (pF) | Resist. ($\Omega$) | | | |
| Boron nitride-dispersed silicon resin | 2 | 5 | 0.16 | 7000 | $2.3 \times 10^{11}$ | Δ | X | ○ |
| Boron nitride-dispersed silicon resin | 2 | 5 | 0.22 | 5000 | $3.2 \times 10^{11}$ | ○ | Δ | ○ |
| Boron nitride-dispersed silicon resin | 2 | 5 | 0.55 | 2000 | $8.0 \times 10^{11}$ | ○ | Δ | ○ |
| Boron nitride-dispersed silicon resin | 2 | 5 | 1.1 | 1000 | $1.6 \times 10^{12}$ | ○ | ○ | ○ |
| Boron nitride-dispersed silicon resin | 2 | 5 | 5.0 | 220 | $7.3 \times 10^{12}$ | ○ | ○ | ○ |
| Boron nitride-dispersed silicon resin | 2 | 5 | 10.5 | 105 | $1.5 \times 10^{13}$ | ○ | ○ | Δ |
| Boron nitride-dispersed silicon resin | 2 | 5 | 13.6 | 80 | 2.0E+13 | ○ | ○ | X |
| Aluminum-oxide dispersed silicon resin | 4 | 5 | 0.32 | 7000 | $1.2 \times 10^{10}$ | Δ | X | ○ |
| Aluminum-oxide dispersed silicon resin | 4 | 5 | 0.44 | 5000 | $1.7 \times 10^{10}$ | ○ | ○ | ○ |
| Aluminum-oxide dispersed silicon resin | 4 | 5 | 1.1 | 2000 | $4.1 \times 10^{10}$ | ○ | ○ | ○ |
| Aluminum-oxide dispersed silicon resin | 4 | 5 | 2.2 | 1000 | $8.2 \times 10^{10}$ | ○ | ○ | ○ |
| Aluminum-oxide dispersed silicon resin | 4 | 5 | 10.0 | 220 | $3.7 \times 10^{11}$ | ○ | ○ | Δ |
| Aluminum-oxide dispersed silicon resin | 5 | 5 | 15.0 | 146 | $5.6 \times 10^{11}$ | ○ | ○ | X |
| Mica | 5 | 0.7 | 0.36 | 7500 | $5.8 \times 10^{8}$ | Δ | X | ○ |
| Mica | 5 | 0.7 | 0.55 | 5000 | $8.9 \times 10^{8}$ | ○ | Δ | ○ |
| Mica | 5 | 0.7 | 1.1 | 2500 | $1.8 \times 10^{9}$ | ○ | Δ | ○ |
| Mica | 5 | 0.7 | 2.7 | 1000 | $4.4 \times 10^{9}$ | ○ | Δ | ○ |
| Mica | 5 | 0.7 | 5.5 | 500 | $8.9 \times 10^{9}$ | Δ | Δ | Δ |
| Alumina plate | 10 | 29 | 0.73 | 7500 | $1.2 \times 10^{10}$ | ○ | Δ | ○ |
| Alumina plate | 10 | 30 | 1.1 | 5000 | $1.8 \times 10^{10}$ | ○ | Δ | ○ |
| Alumina plate | 10 | 30 | 2.2 | 2500 | $3.6 \times 10^{10}$ | ○ | Δ | ○ |
| Alumina plate | 10 | 30 | 5.5 | 1000 | $8.9 \times 10^{10}$ | ○ | ○ | ○ |
| Alumina plate | 10 | 30 | 9.8 | 600 | $1.6 \times 10^{11}$ | ○ | ○ | ○ |
| Zirconia | 28 | 11 | 3.1 | 5000 | $5 \times 10^{9}$ | ○ | Δ | ○ |
| Zirconia | 28 | 11 | 6.1 | 2500 | $9.9 \times 10^{9}$ | ○ | Δ | Δ |
| Zirconia | 28 | 11 | 15 | 1000 | $2.4 \times 10^{10}$ | ○ | ○ | X |
| No insul. layer btwn. chuck top & shield | — | — | — | — | — | X | X | ○ |
| No shield layer | — | — | — | — | — | X | X | ○ |

Next, the chuck top to which the heat-emitting member, the electromagnetic shield layer, the insulating layer, and the guard electrode layer have been attached, is placed on the support member, producing a wafer-prober wafer holder. The holding members were compared at normal probing and probing at high frequencies, at which there is particular susceptibility to the effects of noise. The results are shown in Table XIV. It should be noted that in all cases the diameter of the insulating layer was 280 mm.

In Table XIV, the probing results are denoted by an empty circle if probing is possible with little or no effects from noise, an empty triangle if probing is possible but sometimes the effects of noise do not allow probing to be carried out, and an "x" if the effects from noise are large and frequently do not allow measurement of high frequencies. As regards the temperature control properties, an empty circle indicates that there the temperature response properties are excellent and It is clear from the above that the dielectric constant of the insulating layer preferably is 10 or less, the smaller the better. The capacitance preferably is 5000 pF or less, and it is necessary to have a resistance value of at least $10^{11}\Omega$. It can also be understood that the thickness of the insulating layer preferably is at least 0.2 mm, and more preferably at least 1 mm. Further, it is clear that when the insulating layer is silicon resin in which boron nitride has been dispersed, the insulating layer thickness preferably is not more than 10 mm, and more preferably not more than 5 mm, from the standpoint of temperature control.

Twenty-Second Embodiment

The thickness of the boron nitride dispersed silicon resin insulating layer of Embodiment 21 was changed for the insulating layer between the chuck top and the guard electrode layer (chuck top/guard) and between the electromagnetic shield electrode layer and the guard electrode layer (guard/shield) as shown in Table XV, and the evaluation was performed as in Embodiment 21. The results are shown in Table XV. The probing results and temperature control properties in Table XV are denoted by the same symbols as in Table XIV.

TABLE XV

| | Insulating layer | | | | |
|---|---|---|---|---|---|
| Substance | Thickness btwn. chuck top/card (mm) | Thickness between card/shield | Routine probing results | High RF Probing results | Temp. control properties |
| Boron nitride-dispersed silicon resin | 0.11 | 3.0 | Δ | X | ○ |
| Boron nitride-dispersed silicon resin | 3.0 | 0.11 | Δ | Δ | ○ |
| Boron nitride-dispersed silicon resin | 0.5 | 3.0 | ○ | Δ | ○ |
| Boron nitride-dispersed silicon resin | 3.0 | 0.5 | ○ | ○ | ○ |
| Boron nitride-dispersed silicon resin | 10.5 | 0.5 | ○ | ○ | Δ |
| Boron nitride-dispersed silicon resin | 0.5 | 10.5 | ○ | Δ | Δ |

The above clearly shows that if the insulating layer material is silicon resin in which boron nitride has been dispersed, then it is preferable that the thickness between the chuck top and the guard electrode layer (thickness of the insulating layer) more preferably is about 3 mm and the thickness between the electromagnetic shield electrode layer and the guard electrode layer (thickness of the insulating layer) more preferably is about 0.5 mm.

Twenty-Third Embodiment

The same wafer-prober wafer holder as in Embodiment 21 was produced, except that a metal layer was formed on the lateral surface and the bottom surface of the support member by fastening SUS-grade plates with screws, and probing was performed as in Embodiment 21. The same results as in Embodiment 20 were obtained, and from this it can be understood that forming the metal layer by SUS-grade plate instead of atomizing yields the same results as when the metal layer has been atomized.

Twenty-Fourth Embodiment

The same wafer-prober wafer holder as in Embodiment 21 was produced, except that metal layers were formed on the lateral surface and in the cavity portion of the support member by fastening SUS-grade plates with screws, and probing was performed as in Embodiment 21. The same results as in Embodiment 21 were obtained, and from this it can be understood that forming metal layers on the lateral surface and in the cavity portion in the support member yields the same results as when metal layers are formed on the lateral surface and the bottom surface by atomizing or SUS-grade plates.

Twenty-Fifth Embodiment

The same wafer-prober wafer holder as in Embodiment 21 was produced, except that a metal layer was formed on the lateral surface of the support member by fastening a SUS-grade plate with screws and connected to the guard electrode layer attached to the chuck top, and probing was performed as in Embodiment 21. The same results as in Embodiment 21 were obtained, and from this it can be understood that forming a metal layer on the lateral surface of the support member yields the same results as when metal layers are formed on the lateral surface and the bottom surface through atomizing or SUS-grade plates.

Twenty-Sixth Embodiment

The same wafer-prober wafer holder as in Embodiment 21 was produced, except that the material adopted for the chuck top was a 99.6% pure alumina substrate, and probing was performed as in Embodiment 21. The results are shown in Table XVI. The probing results and temperature control properties in Table XVI are denoted by the same symbols as in Table XIV.

TABLE XVI

| | Insulating layer | | | | | | | |
|---|---|---|---|---|---|---|---|---|
| Substance | Dielec. Const. | Thermal cond. (W/mK) | Thickness (mm) | Cap. (pF) | Resist. (Ω) | Routine probing results | High RF probing results | Temp. control properties |
| Boron nitride-dispersed silicon resin | 2 | 5 | 0.16 | 636 | $3.6 \times 10^{11}$ | Δ | X | ○ |
| Boron nitride-dispersed silicon resin | 2 | 5 | 0.22 | 614 | $4.5 \times 10^{11}$ | ○ | Δ | ○ |
| Boron nitride-dispersed silicon resin | 2 | 5 | 0.55 | 519 | $9.3 \times 10^{11}$ | ○ | Δ | ○ |
| Boron nitride-dispersed silicon resin | 2 | 5 | 1.1 | 412 | $1.6 \times 10^{12}$ | ○ | ○ | ○ |
| Boron nitride-dispersed silicon resin | 2 | 5 | 5.0 | 167 | $7.3 \times 10^{12}$ | ○ | ○ | ○ |
| Boron nitride-dispersed silicon resin | 2 | 5 | 10.5 | 91 | $1.5 \times 10^{13}$ | ○ | ○ | Δ |
| Boron nitride-dispersed silicon resin | 2 | 5 | 13.6 | 72 | $2.0 \times 10^{13}$ | ○ | ○ | X |

TABLE XVI-continued

| | Insulating layer | | | | | Routine probing results | High RF probing results | Temp. control properties |
|---|---|---|---|---|---|---|---|---|
| Substance | Dielec. Const. | Thermal cond. (W/mK) | Thickness (mm) | Cap. (pF) | Resist. (Ω) | | | |
| Aluminum-oxide dispersed silicon resin | 4 | 5 | 0.32 | 636 | $1.3 \times 10^{11}$ | Δ | X | ○ |
| Aluminum-oxide dispersed silicon resin | 4 | 5 | 0.44 | 614 | $1.3 \times 10^{11}$ | ○ | ○ | ○ |
| Aluminum-oxide dispersed silicon resin | 4 | 5 | 1.1 | 519 | $1.3 \times 10^{11}$ | ○ | ○ | ○ |
| Aluminum-oxide dispersed silicon resin | 4 | 5 | 2.2 | 412 | $1.3 \times 10^{11}$ | ○ | ○ | ○ |
| Aluminum-oxide dispersed silicon resin | 4 | 5 | 10.0 | 167 | $1.3 \times 10^{11}$ | ○ | ○ | Δ |
| Aluminum-oxide dispersed silicon resin | 5 | 5 | 15.0 | 121 | $1.3 \times 10^{11}$ | ○ | ○ | X |
| Mica | 5 | 0.7 | 0.36 | 640 | $1.3 \times 10^{11}$ | Δ | X | ○ |
| Mica | 5 | 0.7 | 0.55 | 614 | $1.3 \times 10^{11}$ | ○ | Δ | ○ |
| Mica | 5 | 0.7 | 1.1 | 547 | $1.3 \times 10^{11}$ | ○ | Δ | ○ |
| Mica | 5 | 0.7 | 2.7 | 412 | $1.3 \times 10^{11}$ | ○ | Δ | ○ |
| Mica | 5 | 0.7 | 5.5 | 292 | $1.3 \times 10^{11}$ | Δ | Δ | Δ |
| Alumina plate | 10 | 29 | 0.73 | 640 | $1.3 \times 10^{11}$ | ○ | Δ | ○ |
| Alumina plate | 10 | 30 | 1.1 | 614 | $1.3 \times 10^{11}$ | ○ | Δ | ○ |
| Alumina plate | 10 | 30 | 2.2 | 547 | $1.3 \times 10^{11}$ | ○ | Δ | ○ |
| Alumina plate | 10 | 30 | 5.5 | 412 | $1.3 \times 10^{11}$ | ○ | ○ | ○ |
| Alumina plate | 10 | 30 | 9.8 | 323 | $1.6 \times 10^{11}$ | ○ | ○ | ○ |
| Zirconia | 28 | 11 | 3.1 | 614 | $1.3 \times 10^{11}$ | ○ | Δ | ○ |
| Zirconia | 28 | 11 | 6.1 | 547 | $1.3 \times 10^{11}$ | ○ | Δ | Δ |
| Zirconia | 28 | 11 | 15 | 412 | $1.3 \times 10^{11}$ | ○ | ○ | X |
| No insul. layer btwn. chuck top & shield | — | — | — | 700 | $1.3 \times 10^{11}$ | ○ | ○ | ○ |
| No shield layer | — | — | — | — | — | X | X | ○ |

From the above, it can be understood that when an insulating substrate is used for the chuck top, inserting an insulating layer can reduce the capacitance.

Twenty-Seventh Embodiment

Using the Si—SiC-1 of Embodiment 14, Si—SiC-1 substrates of 310 mm diameter and 10 mm thickness were prepared. Concentric circular grooves for vacuum chuck of the wafer and through-holes were provided in the wafer resting surface of the Si—SiC-1 substrates, and each wafer resting surface was nickel plated to form a chuck top conducting layer. Next, the chuck top conducting layer was polished to give an overall warp amount of 10 µm and a surface roughness Ra of 0.02 µm, producing the chuck top.

A 50 µm thick stainless steel foil was etched to form a heat-emitting member pattern, producing the heat-emitting member. To the lower surface of the chuck top were attached, in this order, a 2 mm thick silicon resin in which boron nitride has been dispersed, a stainless steel foil serving as the electromagnetic shield layer, a 2 mm thick silicon resin in which boron nitride has been dispersed, the heat-emitting member, and a 2 mm thick silicon resin in which boron nitride has been dispersed.

Next, a cylindrical mullite-alumina composite 310 mm in diameter and 40 mm thick was readied as the support member. This support member was counter-bored 295 mm in inner diameter and 20 mm deep. This support member is referred to as an "integral type." A metal layer was formed on the lateral surface and the bottom surface of the support member by atomizing aluminum.

A cylinder 310 mm in outer diameter, 295 mm in inner diameter, and 40 mm high, and a 20 mm thick, 310 mm diameter circular plate, were readied as a separate support member. This support member is referred to as a "discrete type." The surface roughness of this discrete-type support member was changed as shown in Table XVII by changing the polishing conditions.

Chuck tops to which the heat-emitting member, etc., has been attached were placed on these support members, producing wafer holders for wafer prober. Using these holding members, the wafer temperature was raised to 200° C. and probing was conducted continuously for 10 hours, after which the temperature of the bottom surface of the support member was measured. The results are shown in Table XVII. It should be noted that the roughness of the chuck top surface opposite its wafer resting surface was set to 0.1 µm Ra.

TABLE XVII

| Support member | Cylinder top/bottom sides Ra (µm) | Disk top/bottom sides Ra (µm) | Support member underside temp. (° C.) |
|---|---|---|---|
| Integral type | — | — | 140 |
| Discrete type | 0.05 | 0.05 | 135 |
| Discrete type | 0.1 | 0.1 | 125 |
| Discrete type | 0.5 | 0.5 | 115 |
| Discrete type | 1.0 | 1.0 | 102 |
| Discrete type | 2.0 | 2.0 | 100 |
| Discrete type | 5.0 | 5.0 | 98 |

There were no problems with any of the support members as far as probing was concerned. Further, as can be understood from Table XVII, when the discrete-type support members had a surface roughness of at least 0.1 μm Ra, there was little rise in the temperature of the support member bottom surface.

Twenty-Eighth Embodiment

The chuck top and the discrete-type support members of Embodiment 27 were prepared. 32 mullite-alumina composites 5 mm high, 5 mm diameter were prepared as columnar components. The upper and lower surfaces of the columnar components and the cylinder and circular plate of the support member were given a surface roughness shown in Table XVIII by changing the polishing conditions. Like in Embodiment 27, the wafer temperature was raised to 200° C. and probing was conducted continuously for 10 hours, after which the temperature of the lower surface of the support member was measured. The results are shown in Table XVIII. It should be noted that "with columnar member" indicates those in which the columnar components are sandwiched between the chuck top and the cylinder of the support member.

TABLE XVIII

| Presence of columnar components | Columnar component top/bottom sides Ra (μm) | Cylinder top/bottom sides Ra (μm) | Disk top/bottom sides Ra (μm) | Support member underside temp. (° C.) |
|---|---|---|---|---|
| Absent | — | 0.05 | 0.05 | 135 |
| Present | 0.05 | 0.05 | 0.05 | 125 |
| Present | 0.1 | 0.1 | 0.1 | 115 |
| Present | 0.5 | 0.5 | 0.5 | 105 |
| Present | 1.0 | 1.0 | 1.0 | 92 |
| Present | 2.0 | 2.0 | 2.0 | 90 |
| Present | 5.0 | 5.0 | 5.0 | 88 |

By sandwiching columnar components, it is possible to lower the temperature of the support member bottom surface.

Twenty-Ninth Embodiment

The chuck top and the integral-type support members of Embodiment 27 were prepared. 32 mullite-alumina composites 5 mm high, 5 mm diameter were prepared as columnar components. The upper and lower surfaces of these columnar components and the support member were provided with a surface roughness shown in Table XIX by changing the polishing conditions. Like in Embodiment 27, the wafer temperature was raised to 200° C. and probing was conducted continuously for 10 hours, after which the temperature of the lower surface of the support member was measured. The results are shown in Table XIX. It should be noted that "with columnar member" indicates those in which the columnar components are sandwiched between the chuck top and the cylinder of the support member.

TABLE XIX

| Presence of columnar components | Columnar component top/bottom sides Ra (μm) | Support member top/bottom sides Ra (μm) | Support member underside temp. (° C.) |
|---|---|---|---|
| Absent | — | 0.05 | 138 |
| Absent | — | 0.1 | 128 |
| Absent | — | 0.5 | 118 |
| Absent | — | 1.0 | 105 |
| Absent | — | 2.0 | 103 |
| Absent | — | 5.0 | 101 |
| Present | 0.05 | 0.05 | 128 |
| Present | 0.1 | 0.1 | 118 |
| Present | 0.5 | 0.5 | 108 |
| Present | 1.0 | 1.0 | 95 |
| Present | 2.0 | 2.0 | 93 |
| Present | 5.0 | 5.0 | 91 |

Thirtieth Embodiment

The chuck top and the discrete-type support member of Embodiment 27 were prepared. The support member was processed to an overall surface roughness of Ra 1 μm. The perpendicularity of the cylinder of the support member was changed as shown in Table XX. Then, like in Embodiment 16, probing was conducted at a temperature of 200° C. and an applied load of 3.1 MPa, and evaluation was performed as in Embodiment 15. It should be noted that the degrees of perpendicularity of Table XX are indicated by a value obtained by scaling the measurement length to 100 mm.

TABLE XX

| Perpendicularity (mm) | Distance from center (PCD · mm) | Warpage (μm) | Probing result |
|---|---|---|---|
| 1 | 0 | 3 | ◎ |
| 1 | 180 | 5 | ◎ |
| 1 | 280 | 6 | ◎ |
| 5 | 0 | 4 | ◎ |
| 5 | 180 | 6 | ◎ |
| 5 | 280 | 7 | ◎ |
| 10 | 0 | 5 | ◎ |
| 10 | 180 | 7 | ◎ |
| 10 | 280 | 9 | ◎ |
| 20 | 0 | 8 | ◎ |
| 20 | 180 | 13 | ◎ |
| 20 | 280 | 17 | ◎ |

It became clear that when the degree of perpendicularity of the cylinder of the support member is 10 mm or less, scaling to a measurement length of 100 mm, there is little deformation of the chuck top.

Thirty-First Embodiment

The same chuck top as in Embodiment 3 was prepared. As the support member, three support beams made of cast stainless steel 20 mm high, 10 mm wide, and 15 mm long were prepared. Further, three support posts made of cast stainless steel 10 mm in diameter and 20 mm long were prepared. As the bottom portion of the support member, a 310 mm diameter, 20 mm thick circular plate made of the alumina-3 material used in Embodiment 6 was prepared. These were combined as shown in FIG. 17 and the chuck top was placed thereon, forming a wafer holder. This wafer holder was subjected to probing as in Embodiment 1, and it was possible to perform probing continuously for 24 hours without problem.

INDUSTRIAL APPLICABILITY

With this invention, it is possible to provide a wafer-prober wafer holder that has a structure with excellent heat resistance, that can be made lightweight, that has high stiffness which obviates concern about warping, that has a high dielectric constant in the surface on which the processed object is placed, that has increased temperature uniformity, and with which dies can be cooled rapidly. Further, providing a cooling module also allows the temperature of the chuck top to be raised and lowered more rapidly. A heater unit for a wafer prober that has been provided with this wafer-prober wafer holder, and a wafer prober that has been provided with this heater unit, have high stiffness and an increased heat resisting effect, and thus allow the positional precision and temperature uniformity to be increased and allow dies to be heated and cooled rapidly.

What is claimed is:

1. A wafer-prober wafer holder comprising a chuck top having a chuck-top conducting layer on its front side, and a support member for supporting the chuck top, characterized in that:
the wafer holder has a cavity in a portion between the chuck top and the support member;
a chuck-top contacting portion of said support member has a heat-insulating structure; and
said heat-insulating structure is a structure in which cutting channels are provided in the support surface of the support member.

2. A wafer-prober wafer holder comprising a chuck top having a chuck-top conducting layer on its front side, and a support member for supporting the chuck top, characterized in that:
the wafer holder has a cavity in a portion between the chuck top and the support member;
a chuck-top contacting portion of said support member has a heat-insulating structure;
said insulating structure is a structure in which a plurality of columnar components is provided between the chuck top and the support member; and
the surface roughness of contacting areas of said support member and either the chuck top or columnar components is 0.1 μm or more Ra.

3. The wafer-prober wafer holder recited in claim 2, characterized in that said chuck top is furnished with a heating member.

4. The wafer-prober wafer holder recited in claim 3, characterized in that an electromagnetic shield electrode layer and a guard electrode layer are provided between said chuck top and heating member.

5. The wafer-prober wafer holder recited in claim 4, characterized in that electrically insulating layers are provided between said heating member and electromagnetic shield electrode layer, between the electromagnetic shield electrode layer and the guard electrode layer, and between the guard electrode layer and the chuck top.

6. The wafer-prober wafer holder recited in claim 5, characterized in that the resistance of said electrically insulating layers is at least $10^7$ Ωcm.

7. The wafer-prober wafer holder recited in claim 5, characterized in that the dielectric constant of said electrically insulating layers is 10 or less.

8. The wafer-prober wafer holder recited in claim 5, characterized in that the capacitances either between said chuck top conducting layer and the guard electrode layer, and between the chuck top conducting layer and the electromagnetic shield electrode layer, or between the chuck top and the guard electrode layer, and between the chuck top and the electromagnetic shield electrode layer, together are 5000 pF or less.

9. The wafer-prober wafer holder recited in claim 5, characterized in that said electrically insulating layers are 0.2 mm or more in thickness.

10. The wafer-prober wafer holder recited in claim 4, characterized in that said support member is furnished with through-holes or cuts for leads from a heater electrode of the heating member, and from the electromagnetic shield electrode.

11. The wafer-prober wafer holder recited in claim 3, characterized in that a cooling module is provided either on the cylindrical portion of said support member, or where said support member and said chuck top meet.

12. The wafer-prober wafer holder recited in claim 11, characterized in that said cooling module is a movable type.

13. The wafer-prober wafer holder recited in claim 11, characterized in that the cooling module is anchored to said chuck top.

14. The wafer-prober wafer holder recited in claim 11, characterized in that said chuck top is unitized with the cooling module.

15. The wafer-prober wafer holder recited in claim 14, characterized in that a chuck-top-deformation prevention baseplate is provided on the opposite side of said chuck top from its wafer-carrying surface.

16. The wafer-prober wafer holder recited in claim 2, characterized in that the conformation of said support member is in the form of a cylinder having a bottom.

17. The wafer-prober wafer holder recited in claim 16, characterized in that the thickness of the cylinder portion of said support member is 20 mm or less.

18. The wafer-prober wafer holder recited in claim 16, characterized in that the height of the cylinder portion of said support member is 10 mm or more.

19. The wafer-prober wafer holder recited in claim 16, characterized in that the bottom portion of said support member is 10 mm or more in thickness.

20. The wafer-prober wafer holder recited in claim 16, characterized in that the cylinder portion and the bottom portion of said support member are not integral.

21. The wafer-prober wafer holder recited in claim 20, characterized in that in contacting areas of the bottom portion and the cylinder portion of said support member, the surface roughness of at least either the bottom portion or the cylinder portion is 0.1 μm or more Ra.

22. The wafer-prober wafer holder recited in claim 16, characterized in that the parallelism between the front side of said chuck top conducting layer and the back side of said support member bottom portion is 30 μm or less.

23. The wafer-prober wafer holder recited in claim 2, characterized in that the Young's modulus of said support member is 200 GPa or more.

24. The wafer-prober wafer holder recited in claim 2, characterized in that the thermal conductivity of said support member is 40 W/mK or less.

25. The wafer-prober wafer holder recited in claim 2, characterized in that a main ingredient of the substance forming said support member is whichever of mullite, alumina, or a composite of mullite and alumina.

26. The wafer-prober wafer holder recited in claim 2, characterized in that the surface roughness of the back side of said support member bottom portion is 0.1 μm or more Ra.

27. The wafer-prober wafer holder recited in claim 2, characterized in that the surface roughness of contacting areas of said columnar components and said chuck top is 0.1 μm or more Ra.

28. The wafer-prober wafer holder recited in claim 2, characterized in that perpendicularity either between the outer periphery of the cylinder portion of said support member and the chuck-top contacting surface of the support member, or between the outer periphery of the cylinder portion of the support member and the chuck-top contacting surface of the columnar components, is 10 mm or less, with the measurement length being scaled to 100 mm.

29. The wafer-prober wafer holder recited in claim 2, characterized in that a metal layer is formed superficially on said support member.

30. The wafer-prober wafer holder recited in claim 2, characterized in that a conductor is furnished superficially on at least a portion of said support member.

31. The wafer-prober wafer holder recited in claim 2, characterized in that said support member is furnished with a support post in about the central portion thereof.

32. The wafer-prober wafer holder recited in claim 2, characterized in that warpage in the surface of said chuck top conducting layer is 30 μm or less.

33. The wafer-prober wafer holder recited in claim 2, characterized in that the surface roughness of the front side of said chuck top conducting layer is 0.5 μm or less Ra.

34. The wafer-prober wafer holder recited in claim 2, characterized in that the Young's modulus of said chuck top is 200 GPa or more.

35. The wafer-prober wafer holder recited in claim 2, characterized in that the thermal conductivity of said chuck top is at least 15 W/mK.

36. The wafer-prober wafer holder recited in claim 2, characterized in that the chuck top is 8 mm or more in thickness.

37. The wafer-prober wafer holder recited in claim 2, characterized in that the substance forming said chuck top is a composite of metal and ceramic.

38. The wafer-prober wafer holder recited in claim 37, characterized in that the substance forming said chuck top is whichever of a composite of aluminum and silicon carbide, a composite of silicon and silicon carbide, or a composite of aluminum, silicon and silicon carbide.

39. The wafer-prober wafer holder recited in claim 2, characterized in that the substance forming said chuck top is ceramic.

40. The wafer-prober wafer holder recited in claim 39, characterized in that the substance forming said chuck top is whichever of alumina, mullite, silicon nitride, aluminum nitride, or a composite of alumina and nitride.

41. The wafer-prober wafer holder recited in claim 40, characterized in that the substance forming said chuck top is alumina whose purity is at least 99.6%.

42. The wafer-prober wafer holder recited in claim 2, characterized in that the material making up the chuck top is a metal.

43. The wafer-prober wafer holder recited in claim 42, characterized in that the substance forming said chuck top is tungsten, molybdenum, or an alloy of these.

44. The wafer-prober wafer holder recited in claim 2, characterized in that the warpage in the front side of said chuck top conducting layer is 30 μm or less when a load of 3.1 MPa has been applied to the front side of said chuck top conducting layer.

* * * * *